US008559220B2

(12) United States Patent
Yamazaki et al.

(10) Patent No.: US 8,559,220 B2
(45) Date of Patent: Oct. 15, 2013

(54) SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 325 days.

(21) Appl. No.: 12/952,609

(22) Filed: Nov. 23, 2010

(65) Prior Publication Data

US 2011/0128777 A1 Jun. 2, 2011

(30) Foreign Application Priority Data

Nov. 27, 2009 (JP) ................................. 2009-270667

(51) Int. Cl.
| G11C 16/04 | (2006.01) |
| G11C 16/26 | (2006.01) |
| G11C 16/28 | (2006.01) |
| G11C 5/02 | (2006.01) |
| G11C 5/06 | (2006.01) |
| G11C 5/10 | (2006.01) |
| G11C 11/24 | (2006.01) |
| G11C 7/00 | (2006.01) |
| G11C 11/40 | (2006.01) |
| G11C 11/35 | (2006.01) |
| G11C 11/34 | (2006.01) |

(52) U.S. Cl.
USPC ............. 365/184; 365/149; 365/183; 365/51; 365/63; 365/72; 365/210.11; 365/185.02; 365/185.09; 365/185.17

(58) Field of Classification Search
USPC ............... 365/149, 183, 184, 185.02, 185.09, 365/185.17, 210.11, 51, 63, 72
See application file for complete search history.

(56) References Cited

U.S. PATENT DOCUMENTS

| 4,466,081 A | 8/1984 | Masuoka |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Nakamura et al., "Novel NAND DRAM with surrounding gate transistor (SGT)-Type Gain Cell," The Transactions of the Institute of Electronics and Communication Engineers of Japan, Aug. 1, 2003, vol. J86-C, No. 8, pp. 944-951, Full English Language Translation.

(Continued)

Primary Examiner — J. H. Hur
(74) Attorney, Agent, or Firm — Fish & Richardson P.C.

(57) ABSTRACT

The semiconductor device includes a first wiring; a second wiring; a third wiring; a fourth wiring; a first transistor having a first gate electrode, a first source electrode, and a first drain electrode; and a second transistor having a second gate electrode, a second source electrode, and a second drain electrode. The first transistor is formed on or in a substrate including a semiconductor material. The second transistor includes an oxide semiconductor layer.

18 Claims, 24 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,576,943 B1 | 6/2003 | Ishii et al. |
| 6,727,522 B1 | 4/2004 | Kawasaki et al. |
| 6,873,009 B2 | 3/2005 | Hisamoto et al. |
| 6,876,023 B2 | 4/2005 | Ishii et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0209739 A1 | 11/2003 | Hisamoto et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0221692 A1* | 10/2006 | Chen .................. 365/185.11 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0276689 A1 | 11/2010 | Iwasaki |
| 2010/0279462 A1 | 11/2010 | Iwasaki |
| 2011/0116310 A1 | 5/2011 | Yamazaki et al. |

FOREIGN PATENT DOCUMENTS

| | | |
|---|---|---|
| JP | 57-105889 B | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000269457 A | 9/2000 |
| JP | 2001028443 A | 1/2001 |
| JP | 2001053164 A | 2/2001 |
| JP | 2002-076356 A | 3/2002 |
| JP | 2002-289859 A | 10/2002 |
| JP | 2002-368226 A | 12/2002 |
| JP | 2002368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007103918 A | 4/2007 |
| JP | 2009-033145 A | 2/2009 |
| JP | 2009-182194 A | 8/2009 |
| WO | 2004/114391 A1 | 12/2004 |
| WO | 2007029844 A1 | 3/2007 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology,"SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT,"AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nakamura et al., "Novel NAND DRAM with Surrounding Gate Transistor (SGT)-Type Gain Cell," The Transactions of the Institute of Electronics and Communication Engineers of Japan, Aug. 1, 2003, vol. J86-C, No. 8, pp. 944-951.

"International Search Report (Application No. PCT/JP2010/070419) dated Feb. 15, 2011", in English.

"Written Opinion (Application No. PCT/JP2010/070419) dated Feb. 15, 2011", in English.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

\* cited by examiner

SEMICONDUCTOR DEVICE

TECHNICAL FIELD

The invention disclosed herein relates to a semiconductor device using a semiconductor element and a method for manufacturing the semiconductor device.

BACKGROUND ART

Storage devices using semiconductor elements are broadly classified into two categories: a volatile storage device that loses stored data when power supply stops, and a non-volatile storage device that holds stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, electric charge in a capacitor is lost on the above-described principle; thus, another writing operation is necessary every time data is read out. Moreover, a transistor included in a storage element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, another storage device using a magnetic material or an optical material is further needed in order to hold the data for a long time.

Another example of a volatile storage device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates due to tunneling current generated in writing data, so that the storage element stops its function after a predetermined number of writings. In order to reduce adverse effects of this problem, a method in which the numbers of writings for storage elements are equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding electric charge in the floating gate or removing the electric charge. Further, it takes a relatively long time to hold or remove electric charge, and it is not easy to perform writing and erasing at higher speed.

REFERENCE

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure in which stored data can be stored even when power is not supplied, and there is no limitation on the number of writings.

One embodiment of the present invention is a semiconductor device having a layered structure of a transistor formed using an oxide semiconductor and a transistor formed using a material other than the oxide semiconductor. The structure described below can be employed, for example.

According to one embodiment of the present invention, a semiconductor device includes a source line; a bit line; a first signal line; a plurality of second signal lines; a plurality of word lines; a plurality of memory cells connected in series between the source line and the bit line; a driver circuit configured to drive the plurality of second signal lines and the plurality of word lines so as to select a memory cell specified by an inputted address signal; a writing circuit configured to output a writing potential to the first signal line; a reading circuit configured to compare a plurality of reading potentials and a bit line potential input from the bit line connected to the specified memory cell; a control circuit configured to select any of a plurality of compensation voltages in response to a comparison result of the bit line potential and the plurality of reading potentials; and a potential generation circuit configured to generate the writing potential and the plurality of reading potentials to be supplied to the writing circuit and the reading circuit. One of the plurality of memory cells includes a first transistor having a first gate electrode, a first source electrode, and a first drain electrode; a second transistor having a second gate electrode, a second source electrode, and a second drain electrode; and a capacitor. The first transistor is formed on or in a substrate including a semiconductor material. The second transistor includes an oxide semiconductor layer. The first gate electrode, one of the second source electrode and the second drain electrode, and one of electrodes of the capacitor are electrically connected to each other. The source line and the first source electrode are electrically connected to each other. The bit line and the first drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the other of the electrodes of the capacitor are electrically connected to each other.

According to one embodiment of the present invention, a semiconductor device includes a source line; a bit line: a first signal line; a plurality of second signal lines; a plurality of word lines; a plurality of memory cells connected in series between the source line and the bit line; a driver circuit configured to drive the plurality of second signal lines and the plurality of word lines so as to select a memory cell specified by an inputted address signal; a writing circuit configured to output a first writing potential to the first signal line in a first writing operation, and output any of a plurality of second writing potentials to the first signal line in a second writing operation; a reading circuit configured to read data of the specified memory cell by comparing a first bit line potential input from the bit line connected to the specified memory cell and a plurality of first reading potentials in a first reading operation, and comparing a second bit line potential input from the bit line connected to the specified memory cell and a plurality of second reading potentials in a second reading operation; a control circuit configured to select any of a plurality of compensation voltages in response to a comparison result of the first bit line potential and the plurality of first reading potentials, and select any of the plurality of second writing potentials; and a potential generation circuit configured to generate the first writing potential, the plurality of second writing potentials, the plurality of first reading potentials, and the plurality of second reading potentials to be supplied to the writing circuit and the reading circuit. One of the plurality of memory cells includes a first transistor having a first gate electrode, a first source electrode, and a first drain electrode; a second transistor having a second gate electrode, a second source electrode, and a second drain electrode; and a capacitor. The first transistor is formed on or in a substrate including a semiconductor material. The second transistor includes an oxide semiconductor layer. The first gate electrode, one of the second source electrode and the second drain electrode, and one of electrodes of the capacitor are electrically connected to each other. The source line and the first source electrode are electrically connected to each other. The bit line and the first drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the other of the electrodes of the capacitor are electrically connected to each other.

Any of the above semiconductor devices may include a first selection line, a second selection line, a third transistor having a gate electrode electrically connected to the first selection line, and a fourth transistor having a gate electrode electrically connected to the second selection line. The bit line may be electrically connected to the first drain electrode through the third transistor. The source line may be electrically connected to the first source electrode through the fourth transistor.

In any of the above structures, the first transistor may include a channel formation region provided in the substrate including the semiconductor material, impurity regions provided so as to sandwich the channel formation region, a first gate insulating layer over the channel formation region, the first gate electrode over the first gate insulating layer, and the first source electrode and the first drain electrode electrically connected to the impurity regions.

In any of the above structures, the second transistor may include the second gate electrode over the substrate including the semiconductor material, a second gate insulating layer over the second gate electrode, the oxide semiconductor layer over the second gate insulating layer, and the second source electrode and the second drain electrode electrically connected to the oxide semiconductor layer.

In any of the above structures, a single crystal semiconductor substrate or an SOI substrate is preferably used as the substrate including the semiconductor material. In particular, silicon is preferably used as the semiconductor material.

In any of the above structures, the oxide semiconductor layer is preferably formed using an In—Ga—Zn—O-based oxide semiconductor material. More preferably, the oxide semiconductor layer includes a crystal of $In_2Ga_2ZnO_7$. Moreover, the concentration of hydrogen in the oxide semiconductor layer is preferably $5 \times 10^{19}$ atoms/cm$^3$ or less. The off-state current of the second transistor is preferably $1 \times 10^{-13}$ A or less.

In any of the above structures, the second transistor can be provided in a region overlapping with the first transistor.

Note that in this specification and the like, the terms "over" and "below" do not necessarily mean the positions "directly on" and "directly under", respectively. For example, the expression "a first gate electrode over a gate insulating layer" does not exclude the case where a component is placed between the gate insulating layer and the first gate electrode. Moreover, the terms "over" and "below" are only used for convenience of description and can be switched to each other in the case where the relation of components is reversed, unless otherwise specified.

In addition, in this specification and the like, the terms "electrode" and "wiring" do not have functional limitations. For example, an "electrode" is sometimes used as part of a "wiring", and vice versa. Furthermore, the term "electrode" or "wiring" can also mean a plurality of "electrodes" or "wirings" formed in an integrated manner.

Further, functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" can mean connection with an object having any electric function provided between components. There is no particular limitation on an object having any electric function as long as electric signals can be transmitted and received through it.

Examples of an object having any electric function are a switching element such as a transistor, a resistor, an inductor, a capacitor, and an element with a variety of functions in addition to an electrode and a wiring.

In general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. A substrate in the "SOI substrate" is not limited to a semiconductor substrate such as a silicon wafer and can be a non-semiconductor substrate such as a glass substrate, a quartz substrate, a sapphire substrate, or a metal substrate. In other words, the "SOI substrate" also includes a conductive substrate having an insulating surface and an insulating substrate provided with a layer formed of a semiconductor material in its category. In addition, in this specification and the like, the term "semiconductor substrate" means not only a substrate formed using only a semiconductor material but also any substrate including a semiconductor material. That is, in this specification and the like, the "SOI substrate" is also included in the category of the "semiconductor substrate".

In this specification and the like, a material other than an oxide semiconductor refers any semiconductor material except an oxide semiconductor. Examples of such a material are silicon, germanium, silicon germanium, silicon carbide, and gallium arsenide. Moreover, an organic semiconductor material or the like can be used. Note that when a material included in a semiconductor device or the like is not particularly specified, it is possible to use either an oxide semiconductor material or a semiconductor material other than an oxide semiconductor.

One embodiment of the present invention provides a semiconductor device in which a transistor including a material other than an oxide semiconductor is placed in a lower portion and a transistor including an oxide semiconductor is placed in an upper portion.

Since the off-state current of a transistor including an oxide semiconductor is extremely low, stored data can be stored for an extremely long time by using the transistor. In other words, power consumption can be adequately reduced because refresh operation becomes unnecessary or the frequency of refresh operation can be extremely low. Moreover, stored data can be stored for a long time even when power is not supplied.

Further, data can be written without high voltage, and deterioration of the element does not become a problem. For example, unlike a conventional non-volatile memory, it is not necessary to inject and extract electrons into and from a floating gate, so that deterioration such as deterioration of a gate insulating layer does not occur. That is, a semiconductor device according to one embodiment of the present invention has no limitation on the number of write cycles, which is a problem of a conventional non-volatile memory, and thus has a significantly increased reliability. Furthermore, data is written depending on the on/off state of the transistor, whereby high-speed operation can be easily realized. In addition, there is no need of operation for erasing data.

Since a transistor including a material other than an oxide semiconductor can operate at higher speed than a transistor including an oxide semiconductor, stored data can be read out at high speed by using the transistor including a material other than an oxide semiconductor.

A semiconductor device with a novel feature can be realized by including both the transistor including a material other than an oxide semiconductor and the transistor including an oxide semiconductor.

BRIEF DESCRIPTION OF DRAWINGS

In the accompanying drawings.

BEST MODE FOR CARRYING OUT THE INVENTION

Figure 1A:
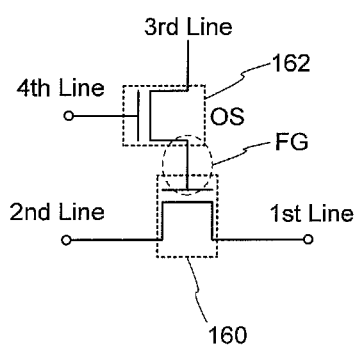
FIGS. 1A to 1D are circuit diagrams each illustrating a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, embodiments of the present invention are not necessarily limited to such a position, size, range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, structures and a manufacturing method of a semiconductor device according to one embodiment of the invention disclosed herein will be described with reference to FIGS. 1A to 1D, FIGS. 2A and 2B, FIGS. 3A to 3H, FIGS. 4A to 4G, FIGS. 5A to 5D, FIG. 6, FIGS. 7A and 7B, FIGS. 8A and 8B, FIG. 9, FIG. 10, FIGS. 11A and 11B, FIGS. 12A and 12B, FIGS. 13A and 13B, FIG. 22, and FIG. 23.

<Circuit Configuration of Semiconductor Device>
In a semiconductor device illustrated in FIG. 1A, a gate electrode of a transistor 160 and one of a source electrode and a drain electrode of a transistor 162 are electrically connected to each other. A first wiring (a 1st line, also referred to as a source line) and a source electrode of the transistor 160 are electrically connected to each other. A second wiring (a 2nd line, also referred to as a bit line) and a drain electrode of the transistor 160 are electrically connected to each other. A third wiring (a 3rd line, also referred to as a first signal line) and the other of the source electrode and the drain electrode of the transistor 162 are electrically connected to each other. A fourth wiring (a 4th line, also referred to as a second signal line) and a gate electrode of the transistor 162 are electrically connected to each other.

Since the transistor 160 including a material other than an oxide semiconductor can operate at higher speed than a transistor including an oxide semiconductor, stored data can be read out at high speed by using the transistor 160. Moreover, the transistor 162 including an oxide semiconductor has extremely low off-state current. For that reason, a potential of the gate electrode of the transistor 160 can be held for an extremely long time by turning off the transistor 162.

The source electrode or the drain electrode of the transistor 162 is electrically connected to the gate electrode of the transistor 160, thereby obtaining a function equivalent to that of a floating gate of a floating gate transistor that is used as a non-volatile memory element. Therefore, in FIGS. 1A to 1D, a portion at which the source electrode or the drain electrode of the transistor 162 is electrically connected to the gate electrode of the transistor 160 is referred to as a floating gate portion FG. The floating gate portion FG is embedded in an insulator and thus can store electric charge. In other words, the off-state current of the transistor 162 is about 100000 times lower than that of the transistor 160 formed using a silicon semiconductor, so that loss of electric charge stored in the floating gate portion FG due to leakage of the transistor 162 can be ignored.

Such a structure can avoid deterioration of a gate insulating film (a tunnel insulating film), which has been a problem of a conventional floating gate transistor. That is, this structure can solve a problem in that a gate insulating film deteriorates due to a tunneling current generated when electrons are injected into a floating gate. For that reason, a limitation on the number of writings can be theoretically ignored in the semiconductor devices illustrated in FIGS. 1A to 1D.

Figure 1B:
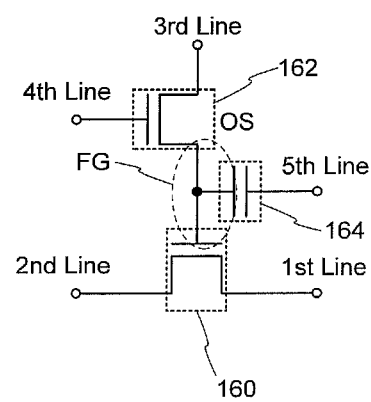

In the semiconductor device illustrated in FIG. 1B, a gate electrode of a transistor 160, one of a source electrode and a drain electrode of a transistor 162, and one electrode of a capacitor 164 are electrically connected to each other. A first wiring and a source electrode of the transistor 160 are electrically connected to each other. A second wiring and a drain electrode of the transistor 160 are electrically connected to each other. A third wiring and the other of the source electrode and the drain electrode of the transistor 162 are electrically connected to each other. A fourth wiring and a gate electrode of the transistor 162 are electrically connected to each other. A fifth wiring and the other electrode of the capacitor 164 are electrically connected to each other.

That is, the semiconductor device in FIG. 1B has a structure in which the capacitor 164 is added to the semiconductor device in FIG. 1A. Thus, the semiconductor device in FIG. 1B can obtain the effect of improving charge retention characteristics in addition to the effects obtained in the semiconductor device in FIG. 1A.

When the capacitance of the capacitor 164 is denoted by C1 and the gate capacitance of the transistor 160 is denoted by C2, C1>C2 is preferable. In the case of C1>C2, the level of a potential supplied to the fifth wiring can be reduced when the potential of the gate electrode of the transistor 160 is controlled using the fifth wiring. Thus, the effect of a reduction in reading voltage can be obtained depending on a method of reading data.

Figure 1C:
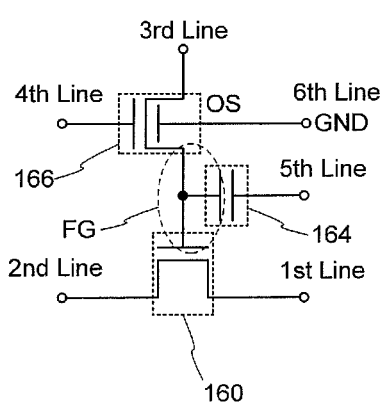

In the semiconductor device illustrated in FIG. 1C, a gate electrode of a transistor 160, one of a source electrode and a drain electrode of a transistor 166, and one electrode of a capacitor 164 are electrically connected to each other. A first wiring and a source electrode of the transistor 160 are electrically connected to each other. A second wiring and a drain electrode of the transistor 160 are electrically connected to each other. A third wiring and the other of the source electrode and the drain electrode of the transistor 166 are electrically connected to each other. A fourth wiring and a first gate electrode of the transistor 166 are electrically connected to each other. A fifth wiring and the other electrode of the capacitor 164 are electrically connected to each other. A sixth wiring and a second gate electrode of the transistor 166 are electrically connected to each other. The sixth wiring may be supplied with a potential different from that of the fourth wiring so as to be controlled independently of the fourth wiring.

That is, in the semiconductor device in FIG. 1C, the transistor 162 of the semiconductor device in FIG. 1B is replaced with the transistor 166 having the second gate electrode. Thus, the semiconductor device in FIG. 1C can obtain the effect of easily adjusting electrical characteristics of the transistor 166 (e.g., the threshold voltage) in addition to the effects obtained in the semiconductor device in FIG. 1B. For example, by application of a negative potential to the sixth wiring, the transistor 166 can be easily normally-off.

Figure 1D:
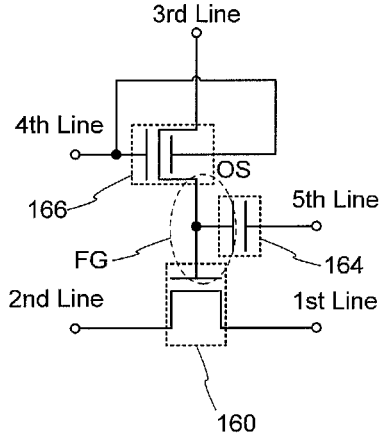

In the semiconductor device illustrated in FIG. 1D, a gate electrode of a transistor 160, one of a source electrode and a drain electrode of a transistor 166, and one electrode of a capacitor 164 are electrically connected to each other. A first wiring and a source electrode of the transistor 160 are electrically connected to each other. A second wiring and a drain electrode of the transistor 160 are electrically connected to each other. A third wiring and the other of the source electrode and the drain electrode of the transistor 166 are electrically connected to each other. A fourth wiring and a first gate electrode of the transistor 166 are electrically connected to each other. A fifth wiring and the other electrode of the capacitor 164 are electrically connected to each other. The first gate electrode of the transistor 166 and a second gate electrode of the transistor 166 are electrically connected to each other.

That is, the semiconductor device in FIG. 1D has a structure in which a potential of the sixth wiring in the semiconductor device in FIG. 1C is equal to a potential of the fourth wiring. Thus, the semiconductor device in FIG. 1D can obtain the effect of increasing the amount of current flowing through the transistor 166 in addition to the effects obtained in the semiconductor device in FIG. 1B.

In the semiconductor devices illustrated in FIGS. 1A to 1D, writing, holding, and reading of data can be performed in the following manner, using the advantage that the potential of the gate electrode of the transistor 160 can be held. Note that although the structure in FIG. 1A is used in the description below, the same can be applied to the other structures.

Firstly, writing and holding of data will be described. First, a potential of the fourth wiring is set to a potential at which the transistor 162 is turned on, and the transistor 162 is turned on. Thus, a potential of the third wiring is supplied to the gate electrode of the transistor 160 (writing). After that, the potential of the fourth wiring is set to a potential at which the transistor 162 is turned off, and the transistor 162 is turned off, whereby the potential of the gate electrode of the transistor 160 is held (holding).

Since the off-state current of the transistor 162 is extremely low, the potential of the gate electrode of the transistor 160 is held for a long time. For example, when the potential of the gate electrode of the transistor 160 is a potential at which the transistor 160 is turned on, the on state of the transistor 160 is kept for a long time. On the other hand, when the potential of the gate electrode of the transistor 160 is a potential at which the transistor 160 is turned off, the off state of the transistor 160 is kept for a long time.

Secondly, reading of data will be described. When a predetermined potential (a low potential) is supplied to the first wiring in a state where the on state or the off state of the transistor 160 is kept as described above, a potential of the second wiring varies depending on whether the transistor 160 is on or off. For example, when the transistor 160 is on, the potential of the second wiring becomes lower in accordance with the potential of the first wiring. In contrast, when the transistor 160 is off, the potential of the second wiring is not changed.

In a state where data is held, the potential of the second wiring is compared with a predetermined potential in such a manner, whereby the data can be read out.

Thirdly, rewriting of data will be described. Rewriting of data is performed in a manner similar to that of the writing and holding of data. That is, the potential of the fourth wiring is set to a potential at which the transistor 162 is turned on, and the transistor 162 is turned on. Thus, a potential of the third wiring (a potential for new data) is supplied to the gate electrode of the transistor 160. After that, the potential of the fourth wiring is set to a potential at which the transistor 162 is turned off, and the transistor 162 is turned off, whereby the new data is stored.

In the semiconductor device according to the invention disclosed herein, data can be directly rewritten by writing data again as described above. For that reason, erasing operation which is necessary for a flash memory or the like is not needed, so that a reduction in operation speed because of erasing operation can be prevented. In other words, high-speed operation of the semiconductor device can be realized.

Note that an n-channel transistor in which electrons are majority carriers is used in the above description; it is needless to say that a p-channel transistor in which holes are majority carriers can be used instead of the n-channel transistor.

<Planar Structure and Cross-Sectional Structure of Semiconductor Device>

Figure 2A:
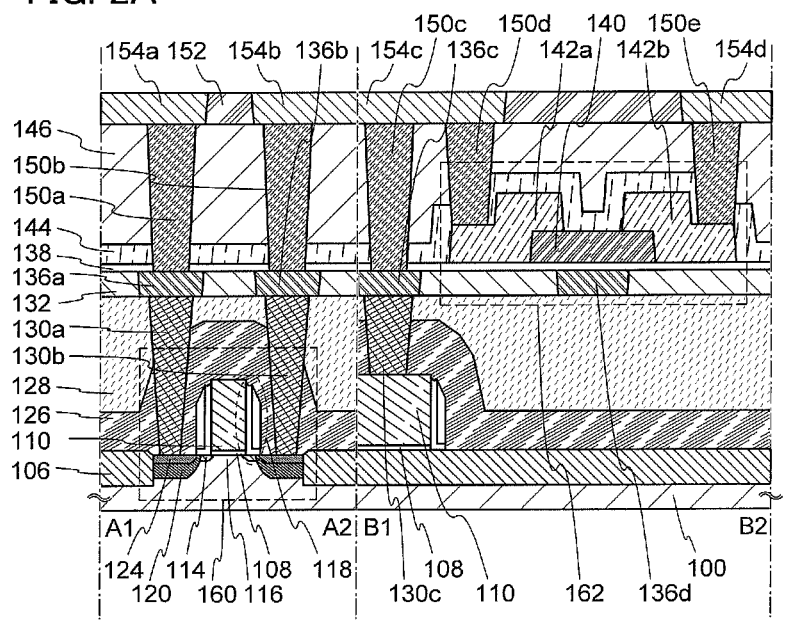
FIGS. 2A and 2B are a cross-sectional view and a plan view for illustrating a semiconductor device.
Figure 2B:
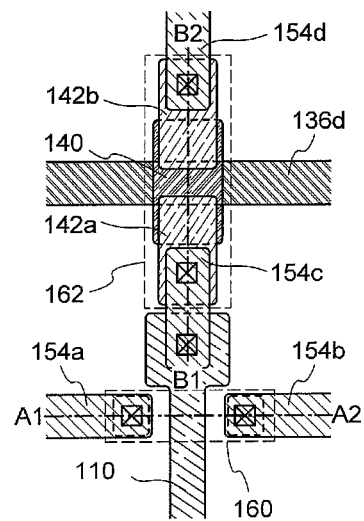

FIGS. 2A and 2B illustrate an example of a structure of the semiconductor device illustrated in FIG. 1A. FIG. 2A illustrates a cross section of the semiconductor device, and FIG. 2B illustrates a plan view of the semiconductor device. Here, FIG. 2A corresponds to a cross section along line A1-A2 and line B1-B2 in FIG. 2B. The semiconductor device illustrated in FIGS. 2A and 2B includes the transistor 160 including a material other than an oxide semiconductor in a lower portion, and the transistor 162 including an oxide semiconductor in an upper portion. Note that the transistors 160 and 162 are n-channel transistors here; alternatively, a p-channel transistor may be used. In particular, it is easy to use a p-channel transistor as the transistor 160. Further, a similar structure can be applied to the semiconductor devices in FIGS. 1B to 1D, for example.

The transistor 160 includes a channel formation region 116 provided in a substrate 100 including a semiconductor material, impurity regions 114 and high-concentration impurity regions 120 (these regions can be collectively referred to simply as impurity regions) provided so as to sandwich the channel formation region 116, a gate insulating layer 108 provided over the channel formation region 116, a gate electrode 110 provided over the gate insulating layer 108, and a source electrode or a drain electrode (hereinafter referred to as a source/drain electrode) 130a and a source/drain electrode 130b electrically connected to the impurity regions 114.

Sidewall insulating layers 118 are provided on a side surface of the gate electrode 110. The high-concentration impurity regions 120 are placed in a region of the substrate 100 that does not overlap with the sidewall insulating layers 118 when seen in the cross-sectional view. Metal compound regions 124 are placed over the high-concentration impurity regions 120. An element isolation insulating layer 106 is provided over the substrate 100 so as to surround the transistor 160. An interlayer insulating layer 126 and an interlayer insulating layer 128 are provided so as to cover the transistor 160. Each of the source/drain electrode 130a and the source/drain electrode 130b is electrically connected to the metal compound regions 124 through an opening formed in the interlayer insulating layers 126 and 128. That is, each of the source/drain electrodes 130a and 130b is electrically connected to the high-concentration impurity regions 120 and the impurity regions 114 through the metal compound regions 124. An electrode 130c that is formed in a manner similar to that of the source/drain electrodes 130a and 130b is electrically connected to the gate electrode 110.

The transistor 162 includes a gate electrode 136d provided over the interlayer insulating layer 128, a gate insulating layer 138 provided over the gate electrode 136d, an oxide semiconductor layer 140 provided over the gate insulating layer 138, and a source/drain electrode 142a and a source/drain electrode 142b that are provided over the oxide semiconductor layer 140 and electrically connected to the oxide semiconductor layer 140.

Here, the gate electrode 136d is provided so as to be embedded in an insulating layer 132 formed over the interlayer insulating layer 128. Like the gate electrode 136d, an electrode 136a, an electrode 136b, and an electrode 136c are formed in contact with the source/drain electrode 130a, the source/drain electrode 130b, and the electrode 130c, respectively.

A protective insulating layer 144 is provided over the transistor 162 so as to be in contact with part of the oxide semiconductor layer 140. An interlayer insulating layer 146 is provided over the protective insulating layer 144. Openings that reach the source/drain electrode 142a and the source/drain electrode 142b are formed in the protective insulating layer 144 and the interlayer insulating layer 146. An electrode 150d and an electrode 150e are formed in contact with the source/drain electrode 142a and the source/drain electrode 142b, respectively, through the respective openings. Like the electrodes 150d and 150e, an electrode 150a, an electrode 150b, and an electrode 150c are formed in contact with the electrode 136a, the electrode 136b, and the electrode 136c, respectively, through openings provided in the gate insulating layer 138, the protective insulating layer 144, and the interlayer insulating layer 146.

Here, the oxide semiconductor layer 140 is preferably a highly purified oxide semiconductor layer from which impurities such as hydrogen are sufficiently removed. Specifically, the concentration of hydrogen in the oxide semiconductor layer 140 is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Moreover, the oxide semiconductor layer 140 preferably contains a sufficient amount of oxygen so that defects due to shortage of oxygen are reduced. The oxide semiconductor layer 140 which is highly purified by a sufficient reduction in hydrogen concentration so that defects due to shortage of oxygen are reduced has a carrier concentration of less than $1 \times 10^{12}$/cm$^3$, preferably $1 \times 10^{11}$/cm$^3$ or less. The transistor 162 with excellent off-state current characteristics can be obtained with the use of such an oxide semiconductor that becomes intrinsic or substantially intrinsic. For example, when the drain voltage Vd is +1 V or +10 V and the gate voltage Vg is in the range of −5 V to −20 V, the off-state current is $1 \times 10^{-13}$ A or less. The oxide semiconductor layer 140 which is highly purified by a sufficient reduction in hydrogen concentration so that defects due to shortage of oxygen are reduced is used to reduce the off-state current of the transistor 162, whereby a semiconductor device with a novel structure can be realized. Note that the concentration of hydrogen in the oxide semiconductor layer 140 is measured by secondary ion mass spectrometry (SIMS).

An insulating layer 152 is provided over the interlayer insulating layer 146. An electrode 154a, an electrode 154b, an electrode 154c, and an electrode 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

That is, in the semiconductor device illustrated in FIGS. 2A and 2B, the gate electrode 110 of the transistor 160 and the source/drain electrode 142a of the transistor 162 are electrically connected through the electrodes 130c, 136c, 150c, 154c, and 150d.

<Method for Manufacturing Semiconductor Device>

Next, an example of a method for manufacturing the semiconductor device will be described. First, a method for manufacturing the transistor 160 in the lower portion will be described below with reference to FIGS. 3A to 3H, and then a method for manufacturing the transistor 162 in the upper portion will be described with reference to FIGS. 4A to 4G and FIGS. 5A to 5D.

<Method for Manufacturing Lower Transistor>

Figure 3A:
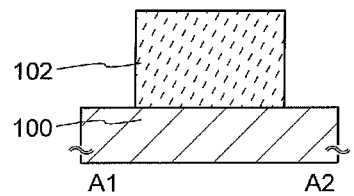
FIGS. 3A to 3H are cross-sectional views illustrating steps for manufacturing a semiconductor device.
Figure 3E:
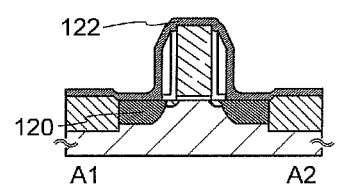

First, the substrate 100 including a semiconductor material is prepared (see FIG. 3A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer therebetween.

A protective layer 102 serving as a mask for forming an element isolation insulating layer is formed over the substrate 100 (see FIG. 3A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 3B). As the etching, dry etching is preferably performed, but wet etching may be performed. An etching gas and an etchant can be selected as appropriate depending on a material of a layer to be etched.

Figure 3B:
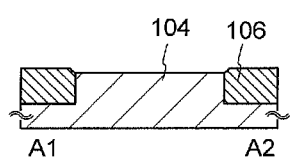
Figure 3F:
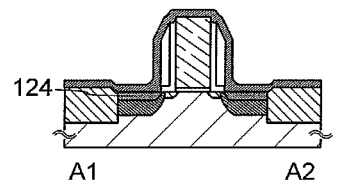

Then, an insulating layer is formed so as to cover the semiconductor region 104, and the insulating layer in a region overlapping with the semiconductor region 104 is selectively removed, so that element isolation insulating layer 106 is formed (see FIG. 3B). The insulating layer is formed using silicon oxide, silicon nitride, silicon nitride oxide, or the like. As a method for removing the insulating layer, any of etching treatment and polishing treatment such as CMP can be employed. Note that the protective layer 102 is removed after the formation of the semiconductor region 104 or after the formation of the element isolation insulating layer 106.

Next, an insulating layer is formed over the semiconductor region 104, and a layer including a conductive material is formed over the insulating layer.

Because the insulating layer serves as a gate insulating layer later, the insulating layer preferably has a single-layer structure or a layered structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can have a thickness of 1 nm to 100 nm, for example.

The layer including a conductive material can be formed using a metal material such as aluminum, copper, titanium, tantalum, or tungsten. The layer including a conductive material may be formed using a semiconductor material such as polycrystalline silicon containing a conductive material. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

Figure 3C:
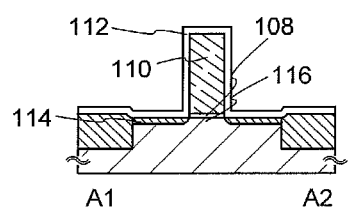

After that, the insulating layer and the layer including a conductive material are selectively etched, so that the gate insulating layer 108 and the gate electrode 110 are formed (see FIG. 3C).

Next, an insulating layer 112 that covers the gate electrode 110 is formed (see FIG. 3C). Then, phosphorus (P), arsenic (As), or the like is added to the semiconductor region 104, so that the impurity regions 114 with a shallow junction depth are formed in the substrate 100 (see FIG. 3C). Note that phosphorus or arsenic is added here in order to form an n-channel transistor; another impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 3C). Here, the concentration of the impurity added is set as appropriate, so that short channel effect can be suppressed. The concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 3G:
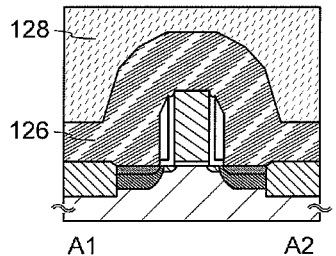
Figure 3D:
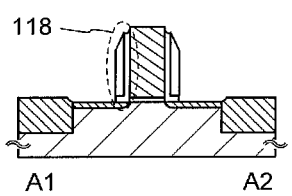

Next, the sidewall insulating layers 118 are formed (see FIG. 3D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed.

Then, an insulating layer is formed so as to cover the gate electrode 110, the impurity regions 114, the sidewall insulating layers 118, and the like. Next, phosphorus (P), arsenic (As), or the like is added to regions where the insulating layer is in contact with the impurity regions 114, so that the high-concentration impurity regions 120 are formed (see FIG. 3E). After that, the insulating layer is removed, and a metal layer 122 is formed so as to cover the gate electrode 110, the sidewall insulating layers 118, the high-concentration impurity regions 120, and the like (see FIG. 3E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 3F). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Then, the interlayer insulating layer 126 and the interlayer insulating layer 128 are formed so as to cover the components formed through the above steps (see FIG. 3G). The interlayer insulating layers 126 and 128 can be formed using a material containing an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 3H:
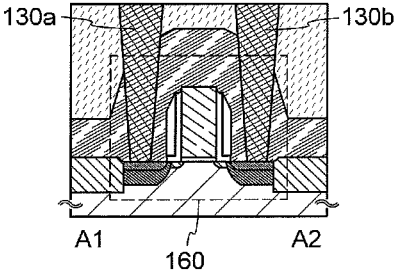

Then, openings that reach the metal compound regions 124 are formed in the interlayer insulating layers, and the source/drain electrode 130a and the source/drain electrode 130b are formed in the openings (see FIG. 3H). The source/drain electrodes 130a and 130b can be formed in such a manner, for example, that a conductive layer is formed in a region including the openings by a PVD method, a CVD method, or the like and then part of the conductive layer is removed by etching, CMP, or the like.

Note that in the case where the source/drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed so as to be embedded in the openings, an unnecessary part of the tungsten film, the titanium film, the titanium nitride film, or the like is removed and the planarity of the surface can be improved by subsequent CMP. By planarizing the surface including the source/drain electrodes 130a and 130b in such a manner, an electrode, a wiring, an insulating layer, a semiconductor layer, and the like can be favorably formed in later steps.

Note that only the source/drain electrodes 130a and 130b in contact with the metal compound regions 124 are shown here; however, an electrode that is in contact with the gate electrode 110 (e.g., the electrode 130c in FIG. 2A) and the like can also be formed in this step. There is no particular limitation on a material used for the source/drain electrodes 130a and 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 including a semiconductor material is formed. Note that an electrode, a wiring, an insulating layer, or the like may be further formed after the above steps. When the wiring has a multi-layer structure of a layered structure including an interlayer insulating layer and a conductive layer, a highly integrated semiconductor device can be provided.

<Method for Manufacturing Upper Transistor>

Next, steps for manufacturing the transistor 162 over the interlayer insulating layer 128 will be described with reference to FIGS. 4A to 4G and FIGS. 5A to 5D. Note that FIGS. 4A to 4G and FIGS. 5A to 5D illustrate steps for manufacturing electrodes, the transistor 162, and the like over the interlayer insulating layer 128; therefore, the transistor 160 and the like placed below the transistor 162 are omitted.

Figure 4A:
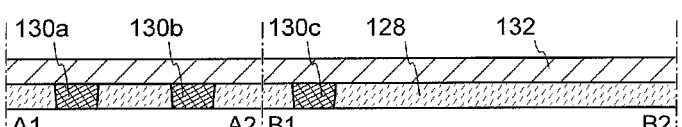
FIGS. 4A to 4G are cross-sectional views illustrating steps for manufacturing a semiconductor device.
Figure 4B:
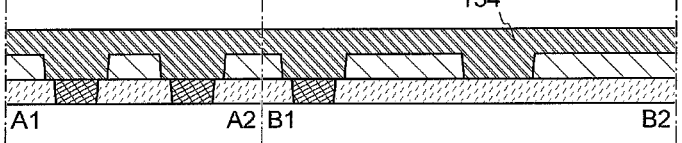

First, the insulating layer 132 is formed over the interlayer insulating layer 128, the source/drain electrodes 130a and 130b, and the electrode 130c (see FIG. 4A). The insulating layer 132 can be formed by a PVD method, a CVD method, or the like. The insulating layer 132 can be formed using a material containing an inorganic insulating material such as silicon oxide, silicon nitride oxide, silicon nitride, hafnium oxide, aluminum oxide, or tantalum oxide.

Next, openings that reach the source/drain electrodes 130a and 130b and the electrode 130c are formed in the insulating layer 132. At this time, an opening is also formed in a region where the gate electrode 136d is to be formed later. Then, a conductive layer 134 is formed so as to be embedded in the openings (see FIG. 4B). The openings can be formed by etching using a mask, or the like. The mask can be formed by light exposure using a photomask, for example. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film at the interface with lower electrodes (here, the source/drain electrodes 130a and 130b, the electrode 130c, and the like) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 4C:
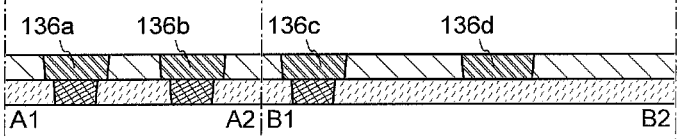

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 4C). Note that when the electrodes 136a, 136b, and 136c and the gate electrode 136d are formed by removing part of the conductive layer 134, the process is preferably performed so that the surfaces are planarized. By planarizing the surfaces of the insulating layer 132, the electrodes 136a, 136b, and 136c, and the gate electrode 136d in such a manner, an electrode, a wiring, an insulating layer, a semiconductor layer, and the like can be favorably formed in later steps.

Figure 4D:
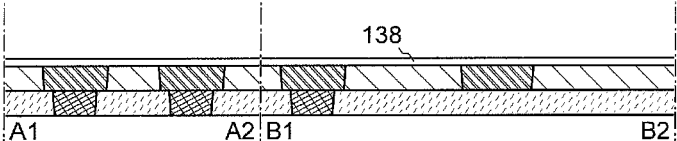

Next, the gate insulating layer 138 is formed so as to cover the insulating layer 132, the electrodes 136a, 136b, and 136c, and the gate electrode 136d (see FIG. 4D). The gate insulating layer 138 can be formed by a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a layered structure. For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138; the gate insulating layer 138 can have a thickness of 10 nm to 500 nm, for example. In the case of employing a layered structure, for example, the gate insulating layer 138 is preferably a stack of a first gate insulating layer having a thickness of 50 nm to 200 nm, and a second gate insulating layer with a thickness of 5 nm to 300 nm over the first gate insulating layer.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and interface characteristics can be favorable.

It is needless to say that, even when a highly purified oxide semiconductor layer is used, another method such as a sputtering method or a plasma CVD method can be employed as long as a high-quality insulating layer can be formed as a gate insulating layer. It is possible to use an insulating layer whose quality and characteristics of the interface with the oxide semiconductor layer are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

In a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electric field (B: bias) and high temperature (T: temperature), and a dangling bond generated causes a drift of the threshold voltage (Vth).

In contrast, impurities of an oxide semiconductor, particularly hydrogen and water, are reduced as much as possible and interface characteristics between the oxide semiconductor and the gate insulating layer are made favorable as described above, whereby a transistor that is stable through the BT test can be obtained.

Figure 4E:
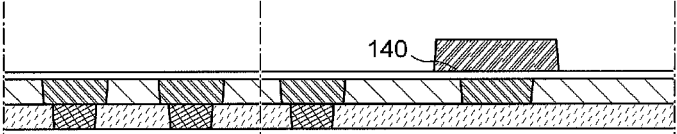

Next, an oxide semiconductor layer is formed over the gate insulating layer 138 and processed by a method such as etching using a mask, so that the island-shaped oxide semiconductor layer 140 is formed (see FIG. 4E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer, which is preferably amorphous in particular. In this embodiment, as the oxide semiconductor layer, an amorphous oxide semiconductor layer is formed by a sputtering method using a target for depositing an In—Ga—Zn—O-based oxide semiconductor. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt %.

As a target used for forming an oxide semiconductor layer by a sputtering method, a metal oxide target containing zinc oxide as its main component can be used, for example. Moreover, a target for depositing an oxide semiconductor containing In, Ga, and Zn (a composition ratio of $In_2O_3:Ga_2O_3$: ZnO=1:1:1 [molar ratio] and In:Ga:Zn 1:1:0.5 [molar ratio]) can be used, for example. Furthermore, a target for depositing an oxide semiconductor containing In, Ga, and Zn (a composition ratio of $In_2O_3:Ga_2O_3:ZnO$=1:1:2 [molar ratio] or a composition ratio of $In_2O_3:Ga_2O_3:ZnO$=1:1:4 [molar ratio]) may be used. The filling rate of a target for depositing an oxide semiconductor is 90% to 100%, preferably greater than or equal to 95% (e.g., 99.9%). A dense oxide semiconductor layer is formed using a target for depositing an oxide semiconductor with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a hydroxyl group, or hydride is removed to a concentration of a few parts per million (preferably parts per billion).

In forming the oxide semiconductor layer, the substrate is held in a treatment chamber that is maintained at reduced pressure and the substrate temperature is set to 100° C. to 600° C., preferably 200° C. to 400° C. The oxide semiconductor layer is formed while the substrate is heated, so that the impurity concentration of the oxide semiconductor layer can be reduced. Moreover, damage due to sputtering is reduced. Then, a sputtering gas from which hydrogen and water are removed is introduced into the treatment chamber from which remaining moisture is being removed, and metal oxide is used as a target, so that the oxide semiconductor layer is formed. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power is 0.5 kW; and the atmosphere is oxygen (the flow rate ratio of oxygen is 100%). Note that it is preferable to use a pulse direct current (DC) power supply because powder substances (also referred to as particles or dust) generated in film deposition can be reduced and the thickness distribution is uniform. The thickness of the oxide semiconductor layer is 2 nm to 200 nm, preferably 5 nm to 30 nm. Note that an appropriate thickness differs depending on an oxide semiconductor material, and the thickness is set as appropriate depending on the material to be used.

Note that before the oxide semiconductor layer is formed by a sputtering method, dust on a surface of the gate insulating layer 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that a nitrogen atmosphere, a helium atmosphere, an oxygen atmosphere, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, an ammonia peroxide mixture (hydrogen peroxide solution of 31 wt %: ammonia solution of 28 wt %: water=5:2:2), or the like can be used. An etchant such as ITO07N (produced by Kanto Chemical Co., Inc.) may be used as well.

Then, first heat treatment is preferably performed on the oxide semiconductor layer. The oxide semiconductor layer can be dehydrated or dehydrogenated with the first heat treatment. The temperature of the first heat treatment is higher than or equal to 300° C. and lower than or equal to 750° C., preferably higher than or equal to 400° C. and lower than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. During the heat treatment, the oxide semiconductor layer 140 is not exposed to the air so that entry of water and hydrogen can be prevented.

The heat treatment apparatus is not limited to the electric furnace and can be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows: the substrate is put in an inert gas having a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, in the oxide semiconductor layer, a crystal (the grain size is 1 nm to 20 nm, typically 2 nm to 4 nm) is sometimes mixed in an amorphous oxide semiconductor (e.g., a surface of the oxide semiconductor layer).

The electrical characteristics of the oxide semiconductor layer can be changed by providing a crystalline layer on an amorphous surface. For example, when the oxide semiconductor layer is formed using a target for depositing In—Ga—Zn—O-based oxide semiconductor, the electrical characteristics of the oxide semiconductor layer can be changed by formation of a crystalline portion in which crystal grains of $In_2Ga_2ZnO_7$ with electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a crystalline portion has a function of suppressing entry of an impurity such as water or hydrogen into the oxide semiconductor layer.

Note that the oxide semiconductor layer including the crystalline portion can be formed by heating the surface of the oxide semiconductor layer by a GRTA process. Further, the oxide semiconductor layer can be formed more preferably by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the first heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source electrode and a drain electrode are stacked over the oxide semiconductor layer 140, or after a protective insulating layer is formed over the source and drain electrodes. Such dehydration treatment or dehydrogenation treatment may be performed plural times.

Figure 4F:
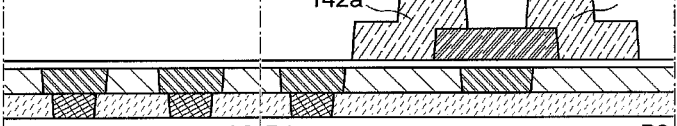

Next, the source/drain electrode 142a and the source/drain electrode 142b are formed in contact with the oxide semiconductor layer 140 (see FIG. 4F). The source/drain electrodes 142a and 142b can be formed in such a manner that a conductive layer is formed so as to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. One or more materials selected from manganese, magnesium, zirconium, beryllium, or thorium may be used. Aluminum combined with one or more of elements selected from titanium, tantalum, tungsten, molybdenum, chromium, neodymium, or scandium may be used. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked.

The conductive layer may be formed using conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, sometimes referred to as ITO), an alloy of indium oxide and zinc oxide ($In_2O_3$—ZnO), and such a metal oxide material containing silicon or silicon oxide.

Here, ultraviolet light, KrF laser light, or ArF laser light is preferably used for light exposure in forming a mask used for etching.

The channel length (L) of the transistor is determined by a distance between a lower edge portion of the source/drain electrode 142a and a lower edge portion of the source/drain electrode 142b. Note that for light exposure in the case where the channel length (L) is less than 25 nm, light exposure for forming a mask is performed with extreme ultraviolet rays whose wavelength is several nanometers to several hundreds of nanometers, which is extremely short. The resolution of light exposure with extreme ultraviolet rays is high and the depth of focus is large. For these reasons, the channel length (L) of the transistor to be formed later can be in the range of 10 nm to 1000 nm, and the circuit can operate at higher speed. Moreover, the off-state current is extremely low, which prevents power consumption from increasing.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source/drain electrode 142a and/or between the oxide semiconductor layer 140 and the source/drain electrode 142b. The oxide conductive layer and a metal layer for forming the source/drain electrodes 142a and 142b can be successively formed. The oxide conductive layer can function as a source region and a drain region. Such an oxide conductive layer can reduce the resistance of the source region and the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Plasma treatment using a gas containing oxygen, such as a mixed gas of oxygen and argon, may be performed, whereby oxygen can be supplied to the oxide semiconductor layer and defects due to shortage of oxygen can be reduced.

Figure 4G:
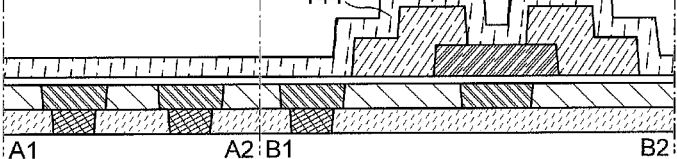

Next, the protective insulating layer 144 is formed in contact with part of the oxide semiconductor layer 140 without exposure to the air (see FIG. 4G).

The protective insulating layer 144 can be formed by a method by which impurities such as water and hydrogen are prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature in forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the protective insulating layer 144 contains hydrogen as little as possible.

Moreover, the protective insulating layer 144 is preferably formed while water left in the treatment chamber is removed, in order that hydrogen, a hydroxyl group, or water is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example; thus, the impurity concentration of the protective insulating layer 144 formed in the deposition chamber can be reduced.

As a sputtering gas used for forming the protective insulating layer 144, it is preferable to use a high-purity gas from which an impurity such as hydrogen, water, a hydroxyl group, or hydride is removed to a concentration of a few parts per million (preferably parts per billion).

Next, second heat treatment is preferably performed in an inert gas atmosphere or an oxygen gas atmosphere (at 200° C. to 400° C., for example, at 250° C. to 350° C.). For example, the second heat treatment is performed at 250° C. for one hour in a nitrogen atmosphere. The second heat treatment can reduce variation in electric characteristics of the transistor. Furthermore, with the second heat treatment, oxygen can be supplied to the oxide semiconductor layer.

In addition, third heat treatment may be performed at 100° C. to 200° C. for 1 hour to 30 hours in the air. This heat treatment may be performed at a fixed heating temperature; alternatively, the following change in the heating temperature may be conducted plural times repeatedly: the heating temperature is increased from room temperature to a temperature of 100° C. to 200° C. and then decreased to room temperature. This heat treatment may be performed under a reduced pressure before the protective insulating layer is formed. The heat treatment time can be shortened under the reduced pressure. The third heat treatment may be performed instead of the second heat treatment or may be performed before or after the second heat treatment, for example.

Figure 5A:
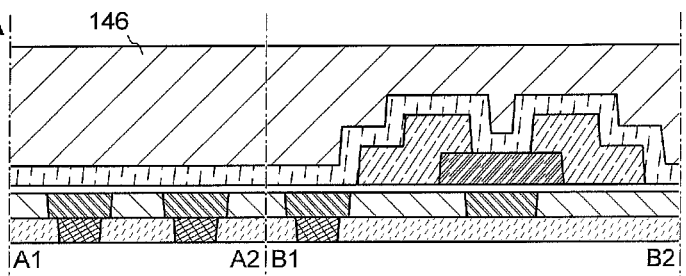
FIGS. 5A to 5D are cross-sectional views illustrating steps for manufacturing a semiconductor device.
Figure 5B:
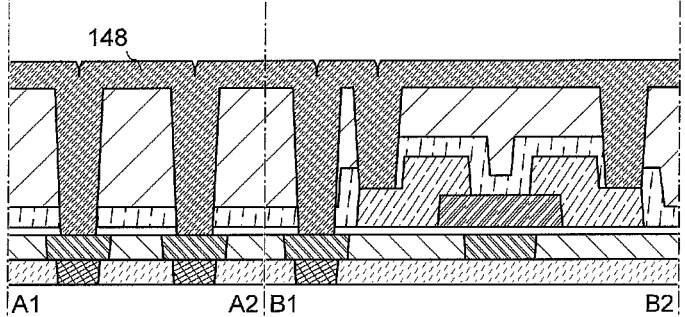

Next, the interlayer insulating layer 146 is formed over the protective insulating layer 144 (see FIG. 5A). The interlayer insulating layer 146 can be formed by a PVD method, a CVD method, or the like. The interlayer insulating layer 146 can be formed using a material containing an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136*a*, 136*b*, and 136*c* and the source/drain electrodes 142*a* and 142*b* are formed in the interlayer insulating layer 146, the protective insulating layer 144, and the gate insulating layer 138. Then, a conductive layer 148 is formed so as to be embedded in the openings (see FIG. 5B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film at the interface with lower electrodes (here, the electrodes 136*a*, 136*b*, and 136*c* and the source/drain electrodes 142*a* and 142*b*) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 5C:
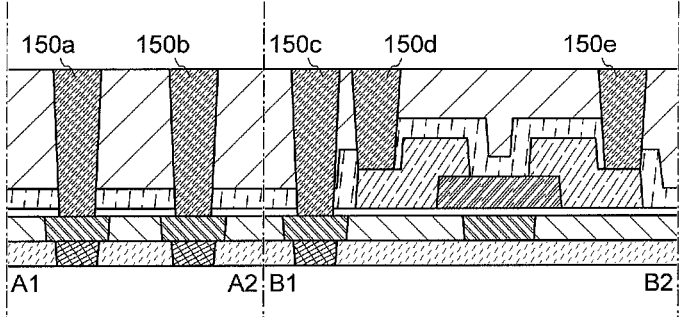
Figure 5D:
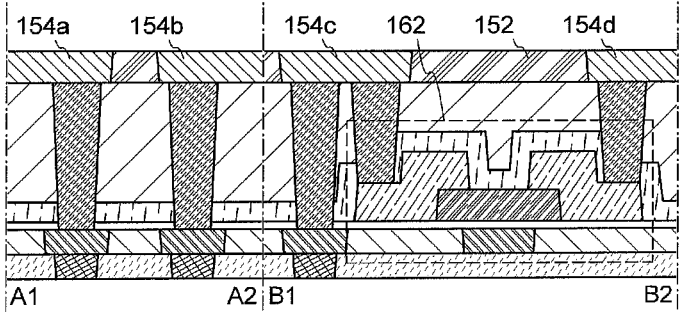

After the conductive layer 148 is formed, part of the conductive layer 148 is removed by etching, CMP, or the like, so that the interlayer insulating layer 146 is exposed and the electrodes 150*a*, 150*b*, 150*c*, 150*d*, and 150*e* are formed (see FIG. 5C). Note that when the electrodes 150*a*, 150*b*, 150*c*, 150*d*, and 150*e* are formed by removing part of the conductive layer 148, the process is preferably performed so that the surfaces are planarized. By planarizing the surfaces of the interlayer insulating layer 146 and the electrodes 150*a*, 150*b*, 150*c*, 150*d*, and 150*e* in such a manner, an electrode, a wiring, an insulating layer, a semiconductor layer, and the like can be favorably formed in later steps.

Then, the insulating layer 152 is formed, and openings that reach the electrodes 150*a*, 150*b*, 150*c*, 150*d*, and 150*e* are formed in the insulating layer 152. After a conductive layer is formed so as to be embedded in the openings, part of the conductive layer is removed by etching, CMP, or the like. Thus, the insulating layer 152 is exposed and the electrodes 154*a*, 154*b*, 154*c*, and 154*d* are formed (see FIG. 5D). This step is similar to the step of forming the electrode 150*a* and the like; therefore, the detailed description is not repeated.

In the case where the transistor 162 is formed by the above-described method, the hydrogen concentration of the oxide semiconductor layer 140 is $5 \times 10^{19}$ atoms/cm$^3$ or less and the off-state current of the transistor 162 is $1 \times 10^{-13}$ A or less. The transistor 162 with excellent characteristics can be obtained by the application of the oxide semiconductor layer 140 that is highly purified by a sufficient reduction in hydrogen concentration so that defects due to shortage of oxygen are reduced as described above. Moreover, it is possible to manufacture a semiconductor device that has excellent characteristics and includes the transistor 160 formed using a material other than an oxide semiconductor in the lower portion and the transistor 162 formed using an oxide semiconductor in the upper portion.

The significance of realizing a highly purified and intrinsic (i-type) oxide semiconductor, an advantage in forming a semiconductor device with the use of an oxide semiconductor, and the like will be briefly described below.

<Realization of Intrinsic Oxide Semiconductor>

Note that considerable research has been done on properties of oxide semiconductors; however, the research does not include the idea of sufficiently reducing a localized level itself in the band gap. According to one embodiment of the invention disclosed herein, a highly purified and intrinsic (i-type) oxide semiconductor is manufactured by removing water or hydrogen which might be a cause of a localized level. This is based on the idea of sufficiently reducing a localized level itself in the band gap. Thus, excellent industrial products can be manufactured.

Note that when hydrogen, water, or the like is removed, oxygen may be removed at the same time. For that reason, it is preferable to realize a more highly purified and intrinsic (i-type) oxide semiconductor in the following manner: oxygen is supplied to metal dangling bonds generated by shortage of oxygen so that a localized level due to oxygen vacancy is reduced. For example, when an oxide film containing an excessive amount of oxygen is formed in close contact with a channel formation region and heat treatment is performed at 200° C. to 400° C., typically at approximately 250° C., a localized level due to oxygen vacancy can be reduced by the supply of oxygen from the oxide film. In the first to third heat treatment, an inert gas may be switched to a gas containing oxygen. Subsequent to the first to third heat treatment, oxygen can be supplied to the oxide semiconductor through a cooling step in an oxygen atmosphere or an atmosphere form which hydrogen and water are adequately removed.

Degradation of characteristics of the oxide semiconductor is considered to be caused by a shallow level of 0.1 eV to 0.2 eV below the conduction band due to excessive hydrogen, a deep level due to oxygen vacancy, or the like. The technical idea that hydrogen is drastically reduced and oxygen is adequately supplied in order to eliminate such a defect would be right.

An oxide semiconductor is generally considered as an n-type semiconductor; however, according to one embodiment of the invention disclosed herein, an i-type semiconductor is realized by removing impurities such as water and hydrogen and supplying oxygen which is an element contained in the oxide semiconductor. In this respect, it can be said that one embodiment of the invention disclosed herein includes a novel technical idea because it is different from an i-type semiconductor such as silicon added with an impurity element.

<Process Advantages Over Other Semiconductor Materials>

Silicon carbide (e.g., 4H—SiC) is a semiconductor material that can be compared with an oxide semiconductor, for example. An oxide semiconductor and 4H—SiC have some things in common. One example is carrier density. The intrinsic carrier density of the oxide semiconductor at room temperature is estimated to be approximately $1 \times 10^{-7}$/cm$^3$, which is as extremely low as $6.7 \times 10^{-11}$/cm$^3$ of 4H—SiC. When the intrinsic carrier density of the oxide semiconductor is compared with the intrinsic carrier density of silicon (approximately $1.4 \times 10^{10}$/cm$^3$), it is easy to understand that the intrinsic carrier density of the oxide semiconductor is significantly low.

In addition, the energy band gap of the oxide semiconductor is 3.0 eV to 3.5 eV and that of 4H—SiC is 3.26 eV, which means that both the oxide semiconductor and silicon carbide are wide bandgap semiconductors.

In contrast, there is a major difference between the oxide semiconductor and silicon carbide, that is, the process temperature. For example, heat treatment at 1500° C. to 2000° C. for activating dopant is needed in a semiconductor process using silicon carbide, so that it is difficult to form a stack of silicon carbide and a semiconductor element formed using a semiconductor material other than silicon carbide. This is because a semiconductor substrate, a semiconductor element, and the like are damaged by such high temperature. On the other hand, the oxide semiconductor can be formed with heat treatment at 300° C. to 500° C. (at a temperature equal to or lower than the glass transition temperature, approximately 700° C. at the maximum); therefore, a semiconductor element can be formed using an oxide semiconductor after an integrated circuit is formed using another semiconductor material.

The oxide semiconductor has an advantage over silicon carbide in that a low heat-resistant substrate such as a glass substrate can be used. Moreover, the oxide semiconductor also has an advantage in that energy costs can be sufficiently reduced as compared to silicon carbide because heat temperature at high temperature is not necessary.

<Electrical Conduction Mechanism of Transistor Including Oxide Semiconductor>

An electrical conduction mechanism of a transistor including an oxide semiconductor will be described with reference to FIG. 6, FIG. 7, FIGS. 8A and 8B, and FIG. 9. Note that the following description is based on the assumption of an ideal situation for easy understanding and does not necessarily reflect a real situation. Note also that the following description is just a consideration and does not affect the validity of the invention.

Figure 6:
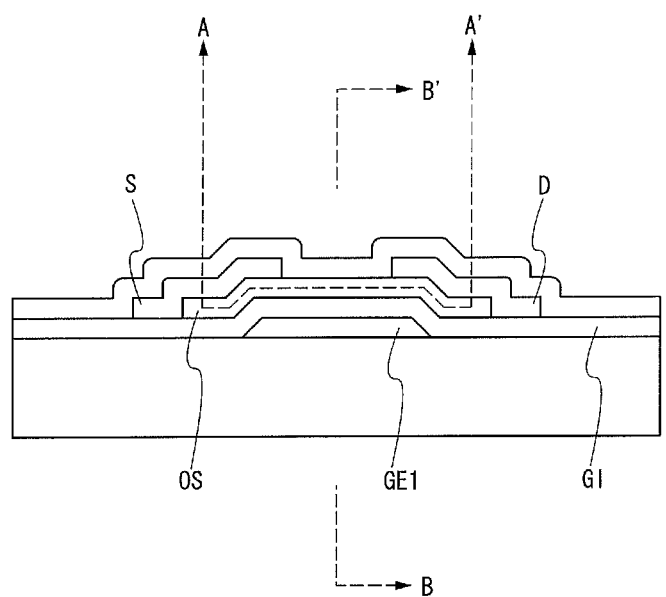
FIG. 6 is a cross-sectional view of a transistor including an oxide semiconductor.

FIG. 6 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 7:
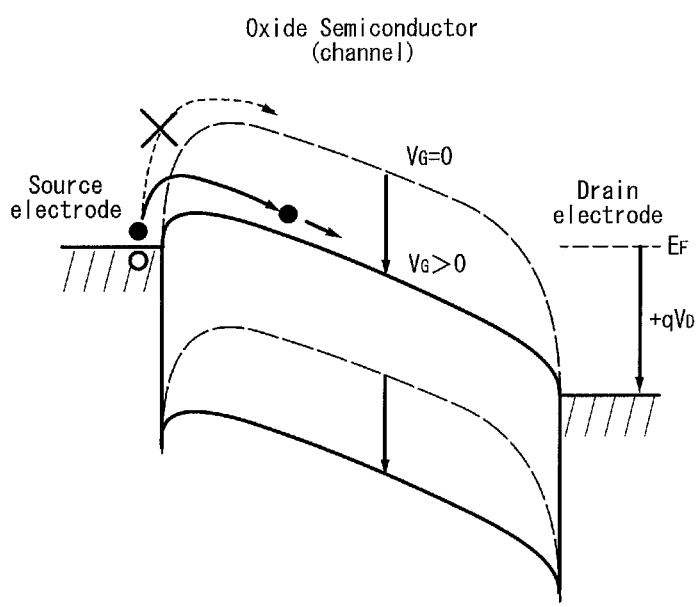
FIG. 7 is an energy band diagram (schematic diagram) along an A-A' section in FIG. 6.

FIG. 7 is an energy band diagram (schematic diagram) of the A-A' section in FIG. 6. In FIG. 7, a black circle (•) and a white circle (○) represent an electron and a hole and have electric charges (−q, +q), respectively. With a positive voltage ($V_D > 0$) applied to the drain electrode, the dashed line shows the case where no voltage is applied to the gate electrode ($V_G = 0$) and the solid line shows the case where a positive voltage is applied to the gate electrode ($V_G > 0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 8A:
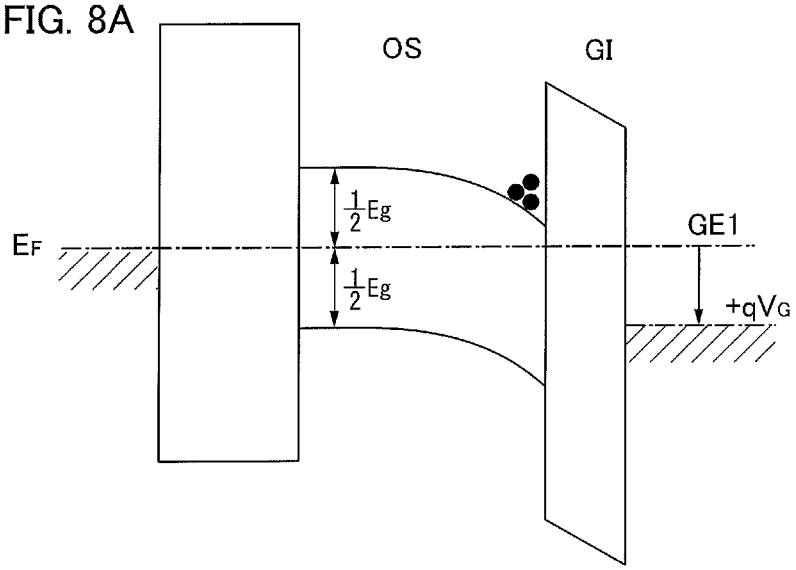
FIG. 8A is a diagram illustrating a state where a positive voltage ($V_G>0$) is applied to a gate (GE1) and FIG. 8B is a diagram illustrating a state where a negative voltage ($V_G<0$) is applied to the gate (GE1)
Figure 8B:
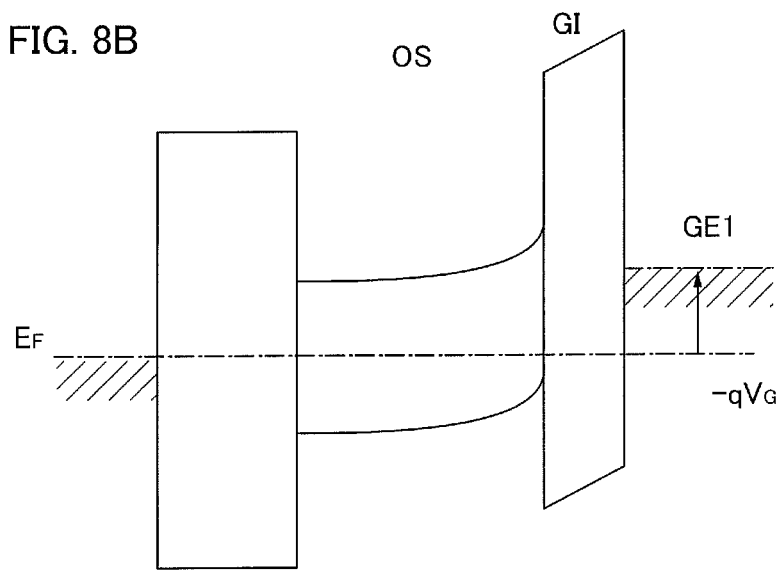

FIGS. 8A and 8B are energy band diagrams (schematic diagrams) of the B-B' section in FIG. 6. FIG. 8A illustrates an on state in which a positive voltage ($V_G$>0) is applied to the gate electrode (GE1) and carriers (electrons) flow between the source electrode and the drain electrode. FIG. 8B illustrates an off state in which a negative voltage ($V_G$<0) is applied to the gate electrode (GE1) and minority carriers do not flow.

Figure 9:
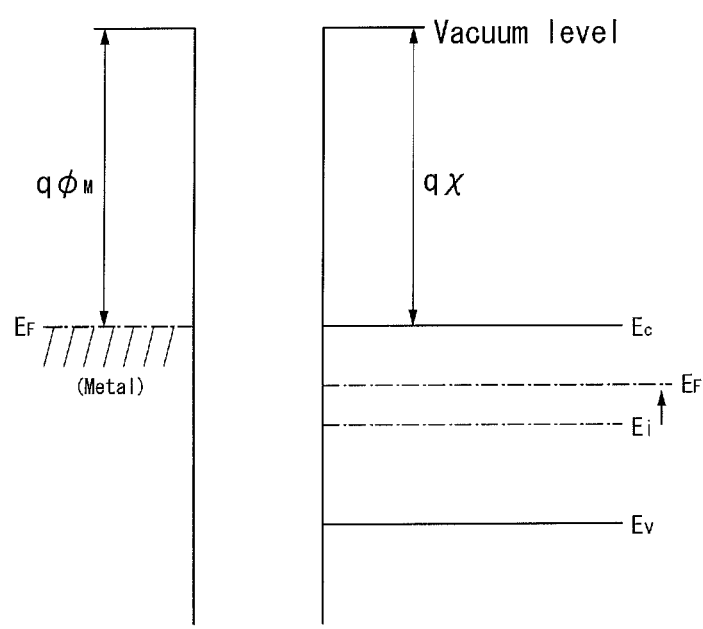
FIG. 9 is a diagram illustrating the relationships between the vacuum level and the work function of a metal ($\phi_M$) and between the vacuum level and the electron affinity ($\chi$) of an oxide semiconductor.

FIG. 9 illustrates the relationships between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is an intrinsic (i-type) or a substantially intrinsic oxide semiconductor which is obtained by removing hydrogen that is a factor for an n-type semiconductor from an oxide semiconductor and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 8A.

In addition, as illustrated in FIG. 8B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ μm and a channel length (L) of 3 μm, for example, it is possible to realize an off-state current of $10^{-13}$ A or less and a subthreshold swing (S value) of 0.1 V/dec (with a 100-nm-thick gate insulating layer).

The oxide semiconductor is purified as described above so as to contain an element other than its main element (i.e., an impurity element) as little as possible, so that the thin film transistor can operate in a favorable manner.

<Carrier Concentration of Oxide Semiconductor>

One of technical ideas according to the invention disclosed herein is that an oxide semiconductor layer is made close to an intrinsic (i-type) oxide semiconductor layer as much as possible by a sufficient reduction in carrier concentration of the oxide semiconductor layer. A method for obtaining the carrier concentration and the carrier concentration measured in an oxide semiconductor layer will be described below with reference to FIG. 22 and FIG. 23.

The carrier concentration in an oxide semiconductor layer can be obtained in such a manner that a MOS capacitor including the oxide semiconductor layer is formed and the result of C-V measurement (C-V characteristics) of the MOS capacitor is evaluated.

The carrier concentration is measured in the following three steps: Step 1 for obtaining C-V characteristics by plotting the relation between the gate voltage Vg and the capacitance C of a MOS capacitor; Step 2 for obtaining a graph representing the relation between the gate voltage Vg and $(1/C)^2$ from the C-V characteristics and obtaining a differentiation of $(1/C)^2$ in a weak inversion region in the graph; and Step 3 for substituting the differentiation obtained into the following Formula 1 representing the carrier density $N_d$. Note that in Formula 1, e represents elementary electric charge, $\epsilon_0$ represents the dielectric constant of vacuum, and $\epsilon$ represents the relative dielectric constant of an oxide semiconductor.

[Formula 1]

$$N_d = -\left(\frac{2}{e\epsilon_0\epsilon}\right) / \frac{d(1/C)^2}{dV} \qquad (1)$$

As a sample for the measurement, a MOS capacitor having the following structure was used. The MOS capacitor includes a 300-nm-thick titanium layer over a glass substrate, a 100-nm-thick titanium nitride layer over the titanium layer, a 2-μm-thick oxide semiconductor layer using an In—Ga—Zn—O-based oxide semiconductor (a-IGZO) over the titanium nitride layer, a 300-nm-thick silicon oxynitride layer over the oxide semiconductor layer, and a 300-nm-thick silver layer over the silicon oxynitride layer.

The oxide semiconductor layer was formed by a sputtering method using a target for depositing an oxide semiconductor containing In, Ga, and Zn (In:Ga:Zn=1:1:0.5 [molar ratio]). The atmosphere in which the oxide semiconductor layer was formed was a mixed atmosphere of argon and oxygen (the flow rates of Ar and $O_2$ were 30 (sccm) and 15 (sccm), respectively).

Figure 22:
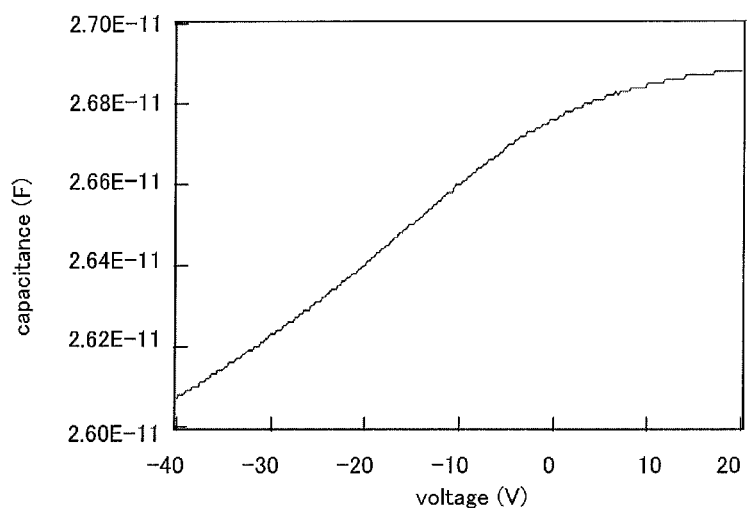
FIG. 22 illustrates C-V characteristics.
Figure 23:
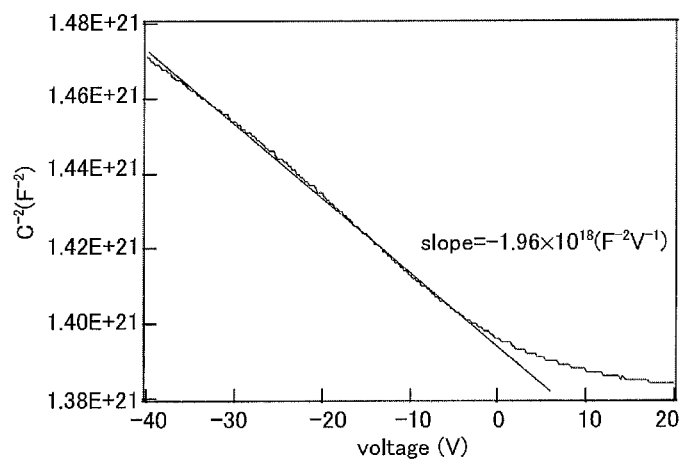
FIG. 23 illustrates a relation between Vg and $(1/C)^2$.

FIG. 22 illustrates C-V characteristics. FIG. 23 illustrates the relation between Vg and $(1/C)^2$. The carrier concentration obtained using Formula 1 with the differentiation of $(1/C)^2$ in the weak inversion region in FIG. 23 was $6.0\times10^{10}/cm^3$.

With the use of an oxide semiconductor that becomes intrinsic or substantially intrinsic (e.g., the carrier concentration is less than $1\times10^{12}/cm^3$ and is preferably $1\times10^{11}/cm^3$ or less), a transistor with excellent off-state current characteristics can be obtained.

As described above, it is understood that the use of an oxide semiconductor, in particular, a highly purified and intrinsic oxide semiconductor can obtain a variety of advantageous effects. Moreover, a semiconductor device with excellent properties is realized by using both a transistor including an oxide semiconductor and a transistor including a material other than an oxide semiconductor as in the invention disclosed herein.

Modification Example

FIG. 10, FIGS. 11A and 11B, FIGS. 12A and 12B, and FIGS. 13A and 13B illustrate modification examples of structures of semiconductor devices. The semiconductor devices in each of which the transistor 162 has a structure different from that described above will be described below as modification examples. That is, the structure of the transistor 160 is the same as the above.

Figure 10:
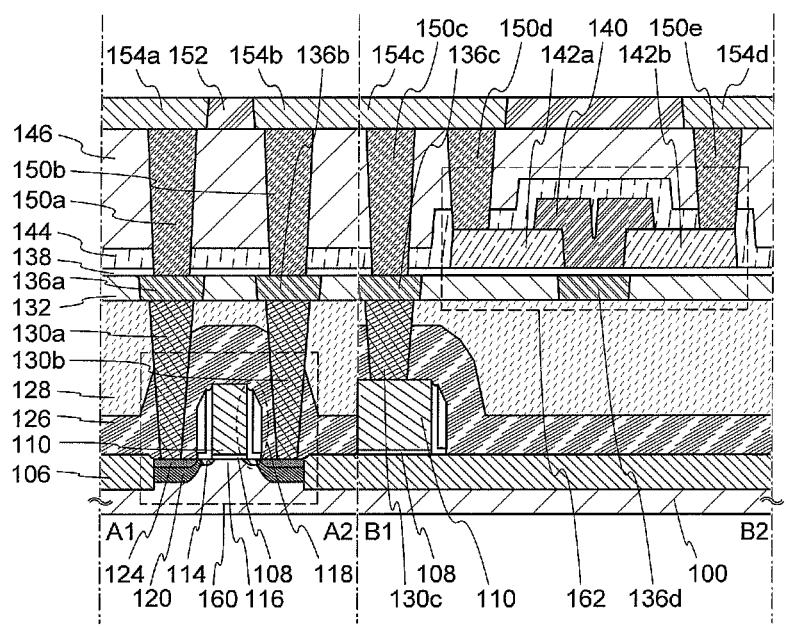
FIG. 10 is a cross-sectional view illustrating a semiconductor device.

FIG. 10 illustrates an example of a semiconductor device including the transistor 162 in which the gate electrode 136d is placed below the oxide semiconductor layer 140 and the source/drain electrodes 142a and 142b are in contact with a bottom surface of the oxide semiconductor layer 140. Note that the planar structure can be changed as appropriate to correspond to the cross section; therefore, only the cross section is shown here.

A big difference between the structure in FIG. 10 and the structure in FIG. 2A is the position at which the oxide semiconductor layer 140 is connected to the source/drain electrodes 142a and 142b. That is, a top surface of the oxide semiconductor layer 140 is in contact with the source/drain electrodes 142a and 142b in the structure in FIG. 2A, whereas the bottom surface of the oxide semiconductor layer 140 is in contact with the source/drain electrodes 142a and 142b in the structure in FIG. 10. Moreover, the difference in the contact position results in a different arrangement of other electrodes, an insulating layer, and the like. The details of each component are the same as those of FIGS. 2A and 2B.

Specifically, the semiconductor device includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

Here, the gate electrode 136d is provided so as to be embedded in the insulating layer 132 formed over the interlayer insulating layer 128. Like the gate electrode 136d, the electrode 136a, the electrode 136b, and the electrode 136c are formed in contact with the source/drain electrode 130a, the source/drain electrode 130b, and the electrode 130c, respectively.

The protective insulating layer 144 is provided over the transistor 162 so as to be in contact with part of the oxide semiconductor layer 140. The interlayer insulating layer 146 is provided over the protective insulating layer 144. Openings that reach the source/drain electrode 142a and the source/drain electrode 142b are formed in the protective insulating layer 144 and the interlayer insulating layer 146. The electrode 150d and the electrode 150e are formed in contact with the source/drain electrode 142a and the source/drain electrode 142b, respectively, through the respective openings. Like the electrodes 150d and 150e, the electrodes 150a, 150b, and 150c are formed in contact with the electrodes 136a, 136b, and 136c, respectively, through openings provided in the gate insulating layer 138, the protective insulating layer 144, and the interlayer insulating layer 146.

Here, the oxide semiconductor layer 140 is preferably a highly purified oxide semiconductor layer from which impurities such as hydrogen are sufficiently removed. Specifically, the concentration of hydrogen in the oxide semiconductor layer 140 is $5\times10^{19}$ atoms/cm$^3$ or less, preferably $5\times10^{18}$ atoms/cm$^3$ or less, more preferably $5\times10^{17}$ atoms/cm$^3$ or less. Moreover, the oxide semiconductor layer 140 preferably contains a sufficient amount of oxygen so that defects due to shortage of oxygen are reduced. The oxide semiconductor layer 140 which is highly purified by a sufficient reduction in hydrogen concentration so that defects due to shortage of oxygen are reduced has a carrier concentration of less than $1\times10^{12}/cm^3$, preferably $1\times10^{11}/cm^3$ or less. The transistor 162 with excellent off-state current characteristics can be obtained with the use of such an oxide semiconductor that becomes intrinsic or substantially intrinsic. For example, when the drain voltage Vd is +1 V or +10 V and the gate voltage Vg is in the range of −5 V to −20 V, the off-state current is $1\times10^{-13}$ A or less. The oxide semiconductor layer 140 which is highly purified by a sufficient reduction in hydrogen concentration so that defects due to shortage of oxygen are reduced is used to reduce the off-state current of the transistor 162, whereby a semiconductor device with a novel structure can be realized. Note that the concentration of hydrogen in the oxide semiconductor layer 140 is measured by secondary ion mass spectrometry (SIMS).

The insulating layer 152 is provided over the interlayer insulating layer 146. The electrodes 154a, 154b, 154c, and 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

Figure 11A:
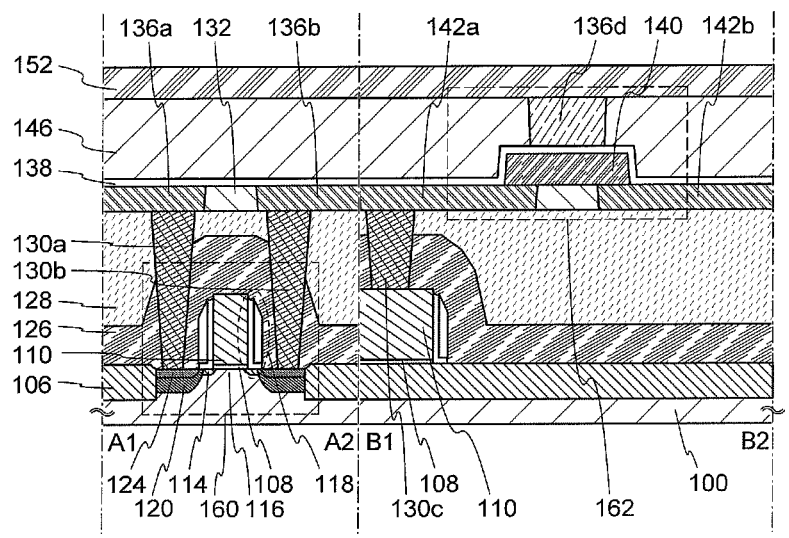
FIGS. 11A and 11B are cross-sectional views each illustrating a semiconductor device.
Figure 11B:
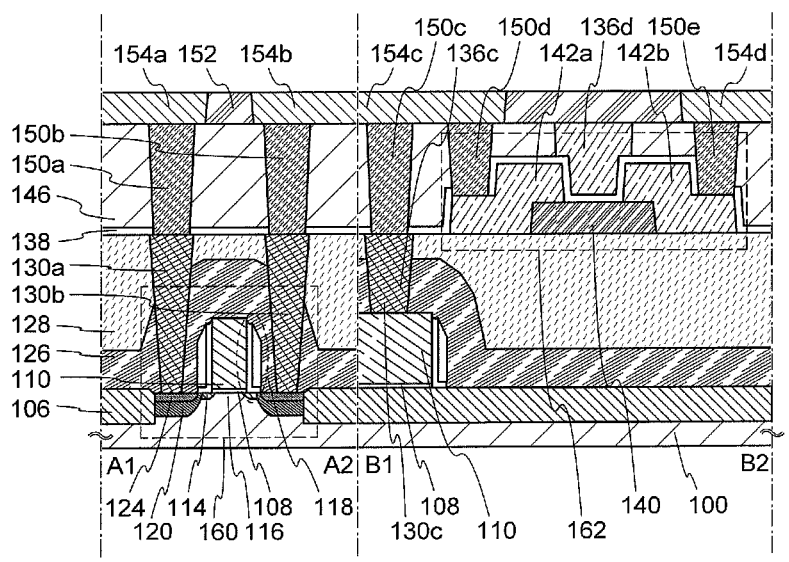

FIGS. 11A and 11B each illustrate an example of a structure of a semiconductor device in which the gate electrode 136d is placed over the oxide semiconductor layer 140. FIG. 11A illustrates an example of a structure in which the source/drain electrodes 142a and 142b are in contact with a bottom surface of the oxide semiconductor layer 140. FIG. 11B illustrates an example of a structure in which the source/drain electrodes 142a and 142b are in contact with a top surface of the oxide semiconductor layer 140.

A big difference between the structures in FIGS. 11A and 11B and those in FIG. 2A and FIG. 10 is that the gate electrode 136d is placed over the oxide semiconductor layer 140. Furthermore, a big difference between the structure in FIG. 11A and the structure in FIG. 11B is that which of the bottom surface or the top surface of the oxide semiconductor layer 140 the source/drain electrodes 142a and 142b are in contact with. Moreover, these differences result in a different arrangement of other electrodes, an insulating layer, and the like. The details of each component are the same as those of FIGS. 2A and 2B, and the like.

Specifically, the semiconductor device illustrated in FIG. 11A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the oxide semiconductor layer 140, and the gate electrode 136d over the gate insulating layer 138 in a region overlapping with the oxide semiconductor layer 140.

The semiconductor device in FIG. 11B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the oxide semiconductor layer 140 and the source/drain electrodes 142a and 142b, and the gate electrode 136d over the gate insulating layer 138 in a region overlapping with the oxide semiconductor layer 140.

Note that in the structures in FIGS. 11A and 11B, a component (e.g., the electrode 150a or the electrode 154a) can be sometimes omitted from the structure in FIGS. 2A and 2B or the like. In that case, a secondary effect such as simplification of a manufacturing process can be obtained. It is needless to say that a nonessential component can be omitted in the structures in FIGS. 2A and 2B and the like.

Figure 12A:
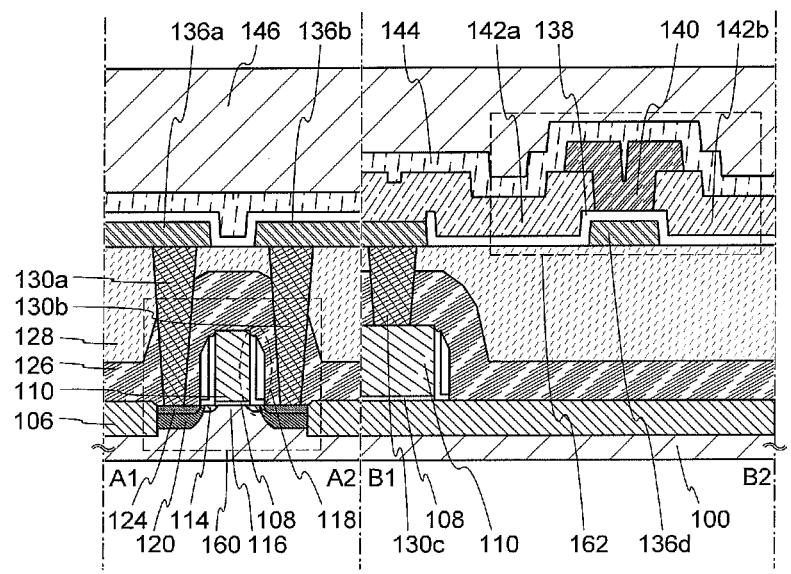
FIGS. 12A and 12B are cross-sectional views each illustrating a semiconductor device.
Figure 12B:
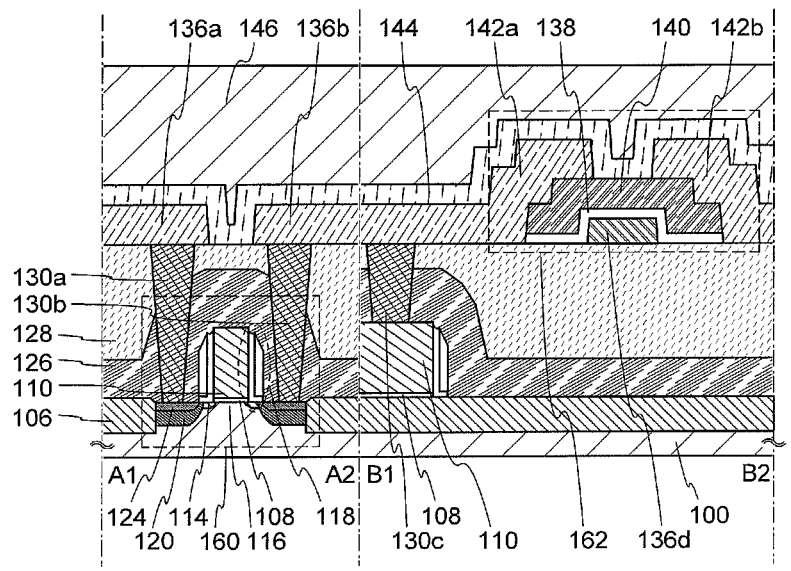

FIGS. 12A and 12B each illustrate an example of the case where the size of the element is relatively large and the gate electrode 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A big difference between the structure in FIG. 12A and the structure in FIG. 12B is that which of the bottom surface or the top surface of the oxide semiconductor layer 140 the source/drain electrodes 142a and 142b are in contact with either. Moreover, this difference results in other electrodes, an insulating layer, and the like being arranged in a different manner. The details of each component are the same as those of FIGS. 2A and 2B, and the like.

Specifically, the semiconductor device in FIG. 12A includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

The semiconductor device in FIG. 12B includes the gate electrode 136d provided over the interlayer insulating layer 128, the gate insulating layer 138 provided over the gate electrode 136d, the oxide semiconductor layer 140 provided over the gate insulating layer 138 overlapping with the gate electrode 136d, and the source/drain electrodes 142a and 142b provided to be in contact with a top surface of the oxide semiconductor layer 140.

Note that also in the structures in FIGS. 12A and 12B, a component can be sometimes omitted from the structure in FIGS. 2A and 2B or the like. Also in this case, a secondary effect such as simplification of a manufacturing process can be obtained.

Figure 13A:
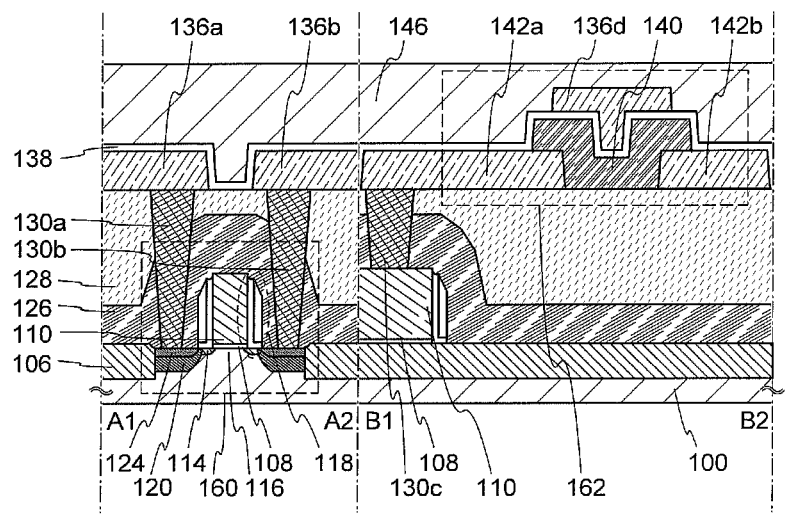
FIGS. 13A and 13B are cross-sectional views each illustrating a semiconductor device.
Figure 13B:
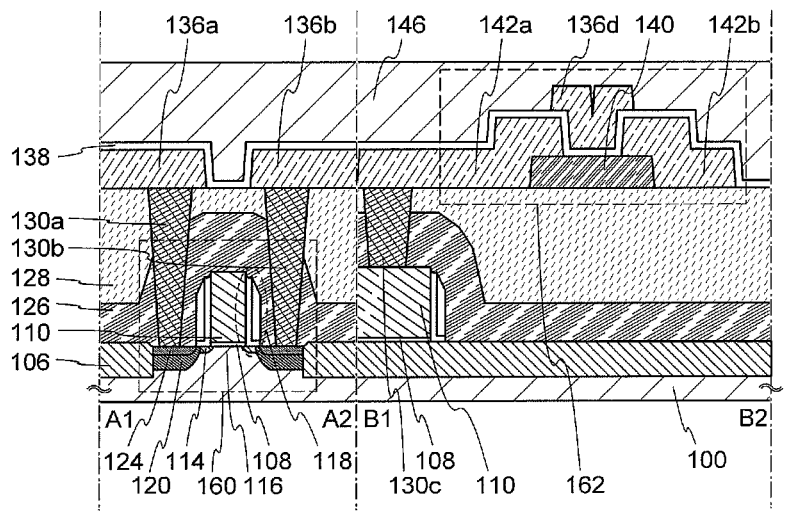

FIGS. 13A and 13B each illustrate an example of the case where the size of the element is relatively large and the gate electrode 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A big difference between the structure in FIG. 13A and the structure in FIG. 13B is that which of the bottom surface or the top surface of the oxide semiconductor layer 140 the source/drain electrodes 142a and 142b are in contact with. Moreover, this difference results in other electrodes, an insulating layer, and the like being arranged in a different manner. The details of each component are the same as those of FIGS. 2A and 2B, and the like.

Specifically, the semiconductor device in FIG. 13A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

The semiconductor device in FIG. 13B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

Note that in the structures in FIGS. 13A and 13B, a component can be sometimes omitted from the structure in FIGS. 2A and 2B or the like. Also in this case, a secondary effect such as simplification of a manufacturing process can be obtained.

As described above, a semiconductor device with a novel structure can be realized according to one embodiment of the invention disclosed herein. In this embodiment, the examples in each of which the semiconductor device is formed by stacking the transistor 160 and the transistor 162 are described; however, the structure of the semiconductor device is not limited to this structure. Moreover, this embodiment shows the examples in each of which the channel length direction of the transistor 160 is perpendicular to that of the transistor 162; however, the positional relation between the transistors 160 and 162 is not limited to this example. In addition, the transistor 160 and the transistor 162 may be provided to overlap with each other.

In this embodiment, the semiconductor device with a minimum storage unit (one bit) is described for simplification; however, the structure of the semiconductor device is not limited thereto. A more advanced semiconductor device can be formed by connecting a plurality of semiconductor devices as appropriate. For example, a NAND-type or NOR-type semiconductor device can be formed by using a plurality of the above-described semiconductor devices. The wiring configuration is not limited to those in FIGS. 1A to 1D and can be changed as appropriate.

The semiconductor device according to this embodiment can store data for an extremely long time because the transistor 162 has low off-state current. That is, refresh operation which is necessary in a DRAM and the like is not needed, so that power consumption can be suppressed. Moreover, the semiconductor device according to this embodiment can be substantially used as a non-volatile storage device.

Since writing or the like of data is performed with switching operation of the transistor 162, high voltage is not necessary and deterioration of the element does not become a problem. Furthermore, data is written and erased depending on the on/off state of the transistor, whereby high-speed operation can be easily realized. In addition, it is also advantageous in that there is no need of operation for erasing data, which is necessary in a flash memory and the like.

Since a transistor including a material other than an oxide semiconductor can operate at higher speed than a transistor including an oxide semiconductor, stored data can be read out at high speed by using the transistor including a material other than an oxide semiconductor.

The structures and methods described in this embodiment can be combined as appropriate with any of the structures and methods described in the other embodiments.

Embodiment 2

In this embodiment, a circuit configuration and operation of a semiconductor device according to one embodiment of the present invention will be described.

Figure 14:
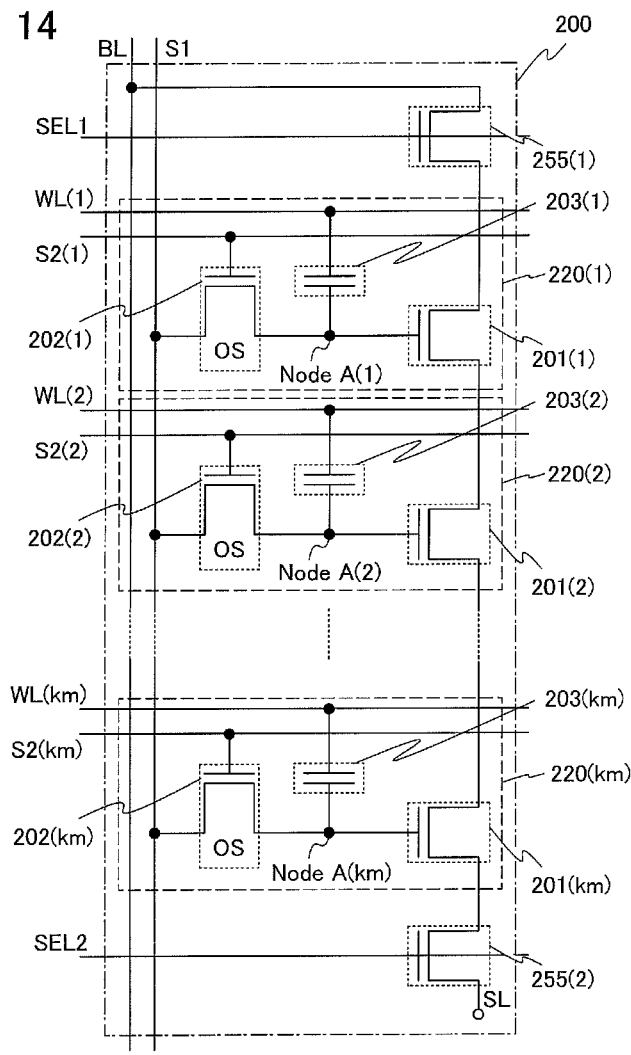
FIG. 14 illustrates a memory cell.

FIG. 14 illustrates an example of a circuit diagram of a semiconductor device (hereinafter also referred to as a NAND memory cell). Here, a NAND memory cell 200 in which memory cells 220 are connected in series is shown as an example.

The NAND memory cell 200 includes a plurality of memory cells 220(1) to 220(km) connected in series, km word lines WL(1) to WL(km), km second signal lines S2(1) to S2(km), a bit line BL, a source line SL, a first signal line S1, two selection lines SEL1 and SEL2, a transistor 255(1) placed between the bit line BL and the memory cell 220(1) along the selection line SEL1, and a transistor 255(2) placed between the source line SL and the memory cell 220(km) along the selection line SEL2.

The memory cell 220(i) (i is an integer of any of 1 to km), which is one of the plurality of memory cells 220, includes the first signal line S1, the second signal line S2(i), the word line WL(i), a transistor 201(i), a transistor 202(i), and a capacitor 203(i). The transistor 201(i) is formed using a material other than an oxide semiconductor. The transistor 202(i) is formed using an oxide semiconductor.

Here, a gate electrode of the transistor 201(i), one of a source electrode and a drain electrode of the transistor 202(i), and one electrode of the capacitor 203(i) are electrically connected to each other. The other of the source electrode and the drain electrode of the transistor 202(i) and the first signal line S1 are electrically connected to each other. The second signal line S2(i) and a gate electrode of the transistor 202(i) are electrically connected to each other. The word line WL(i) and the other electrode of the capacitor 203(i) are electrically connected to each other.

Furthermore, a drain electrode of the transistor 201($i_1$) ($i_1$ is an integer of any of 2 to km) in the memory cell 220($i_1$) is connected to a source electrode of the transistor 201($i_1$−1) in the memory cell 220($i_2$−1). A source electrode of the transistor 201($i_2$) ($i_2$ is an integer of any of 1 to km−1) in the memory cell 220($i_2$) is connected to a drain electrode of the transistor 201($i_2$+1) in the memory cell 220($i_2$+1). A drain electrode of the transistor 201(1) in the memory cell 220(1) is connected to a source electrode of the transistor 255(1). A source electrode of the transistor 201(km) in the memory cell 220(km) is connected to a drain electrode of the transistor 255(2). A drain electrode of the transistor 255(1) is connected to the bit line BL. A source electrode of the transistor 255(2) is connected to the source line SL. That is, the source line SL and a source electrode of the transistor 201(i) are connected through a transistor (which may be included in a memory cell other than the memory cell 220(i)). The bit line BL and a drain electrode of the transistor 201(i) are connected through a transistor (which may be included in a memory cell other than the memory cell 220(i)).

Figure 15:
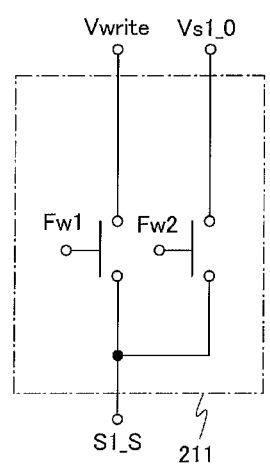
FIG. 15 illustrates a writing circuit.

FIG. 15 illustrates an example of a writing circuit 211. The first signal line S1 is electrically connected to a wiring supplied with a writing potential Vwrite and a wiring supplied with Vs1_0 through switches. The switches are controlled with a signal Fw1 and a signal Fw2.

Figure 16:
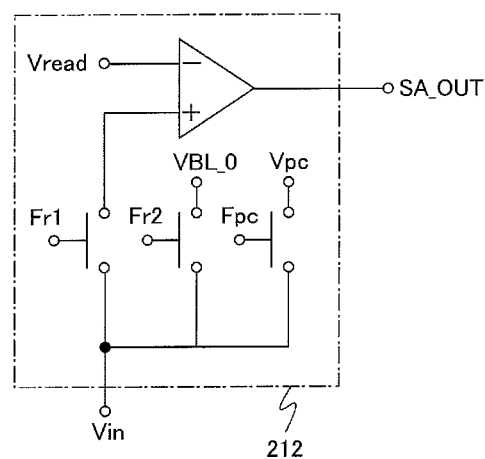
FIG. 16 illustrates a reading circuit.

FIG. 16 illustrates an example of a reading circuit 212. The reading circuit 212 includes a sense amplifier. The reading circuit 212 is electrically connected to the bit line BL. The bit line BL is connected to one input terminal of the sense amplifier through a switch. A potential Vin input to this one input terminal of the sense amplifier can be referred to as a potential of the bit line BL. The other input terminal of the sense amplifier is connected to a wiring supplied with a reading potential Vread. The bit line BL is also connected to a wiring supplied with a potential VBL_0 and a wiring supplied with a potential Vpc through switches. The switches are controlled with a signal Fr1, a signal Fr2, and a signal Fpc.

Next, writing operation and reading operation of the NAND memory cell 200 illustrated in FIG. 14 will be described. Here, operation of the memory cell 220(i) included in the NAND memory cell 200 is specifically described.

The memory cell 220(i) can have a variety of states depending on electric charge or a potential stored at a node A(i). Since the off-state current of the transistor 202(i) is extremely low or substantially zero, the electric charge or the potential at the node A(i) is kept for a long time. In the following description, "writing" refers to charging or discharging of electric charge into/from the node A(i) in the memory cell 220(i) so that the memory cell 220(i) has a predetermined state. The term "reading" refers to comparison of a potential that is determined in accordance with the state of the memory cell 220(i) with a predetermined potential. Note that the term "writing" or "data writing" sometimes refers to a series of operations in which predetermined data is written into a memory cell. Moreover, "reading" or "data reading" sometimes refers to a series of operations in which data stored in a memory cell is read out.

In the case where data is written into the memory cell 220(i), for example, the potential of the word line WL(i) is set to VWL_0 (e.g., 0 V) so that the potential of one electrode of the capacitor is fixed. Moreover, the potential of the second signal line S2(i) is set to VS2_1 (e.g., Vdd) to turn on the transistor 202(i). Furthermore, in the reading circuit 212 that is electrically connected to the bit line BL, the signal Fr2 is asserted and the signal Fr1 and the signal Fpc are deasserted. Thus, the potential VBL_0 is applied to the bit line. Further, in the writing circuit 211 that is electrically connected to the first signal line S1, the signal Fw1 is asserted and the signal Fw2 is deasserted so that the writing circuit 211 has a writing state. Thus, the writing potential Vwrite corresponding to data to be written is applied to the first signal line S1. Note that at the end of the writing, before the potential of the first signal line S1 is changed, the potential of the second signal line S2(i) is set to VS2_0 (e.g., 0 V) to turn off the transistor 202(i).

Note that when data is written, a predetermined potential may be applied to one or both of the source electrode and the drain electrode of the transistor 201(i). For example, the following operation may be performed: the potential of the word line WL(j) (j is an integer of any of i+1 to km) is set to VWL_1 (e.g., Vdd) to turn on the transistor 201(j), the potential of the selection line SEL2 is set to VSEL_1 (e.g., Vdd) to turn on the transistor 255(2), and the potential of the source line SL is set to VSL_0 (e.g., 0 V) so that the potential of the source electrode of the transistor 201(i) is set to VSL_0.

As a result, electric charge corresponding to the potential Vwrite of the first signal line S1 is stored at the node A(i), so that the node A(i) has a predetermined state. Since the off-state current of the transistor 202(i) is extremely low or substantially zero, the potential of the gate electrode of the transistor 201(i) is held for a long time.

When data is read from the memory cell 220(i), the bit line is precharged in advance. In a precharge period, for example, the signal Fpc is asserted and the signals Fr1 and Fr2 are deasserted in the reading circuit 212 so that the precharge potential Vpc is applied to the bit line. Then, the potential of the selection line SEL1 is set to VSEL_1 (e.g., Vdd) to turn on the transistor 255(1), the potentials of the word lines WL(1) to WL(km) are set to VWLread_0 (e.g., Vdd) to turn on the transistors 201(1) to 201(km), and the potential of the selection line SEL2 is set to VSEL_0 (e.g., 0 V) to turn off the transistor 255(2), whereby the precharge potential Vpc is applied to the source electrodes and the drain electrodes of the transistors 201(1) to 201(km).

After the precharge is performed, the signal Fr1 is asserted and the signals Fpc and Fr2 are deasserted in the reading circuit 212 so that the bit line BL and one input terminal of the sense amplifier are connected to each other, and the potential of one input terminal of the sense amplifier is set to the potential of the bit line BL. Moreover, the potential of the selected word line WL(j) is set to VWLread_1 (e.g., 0 V). Furthermore, the potential of the source line SL is raised to VSLread (e.g., Vdd). As a result, a current flows from the source line SL to the bit line BL, and the potential of the bit line BL is increased. When the potential of a node A(j) is denoted by VA(j) and the threshold voltage of the transistor 201(j) is denoted by Vth(j), the potential Vin of the bit line is charged to approximately VA(j)−Vth(j). Then, the reading circuit 212 reads data by comparing Vin and the reading potential Vread.

Note that in the writing circuit 211 connected to the first signal line S1, the signal Fw2 is asserted, the signal Fw1 is deasserted, and the potential VS1_0 (e.g., 0 V) is applied to the first signal line S1.

A potential charged to the bit line will be described. When at least one of the transistors 201(1) to 201(km) is turned off, a current does not flow through the bit line and charge is finished. The potential of the drain electrode by which the transistor 201(i) (i is an integer of any of 1 to km) is turned off when the potential of the source electrode is VSLread is VA(i)−Vth(i). That is, the bit line is charged to the lowest potential among the potentials VA(1)−Vth(1) to VA(km)−Vth (km).

In view of the above, in order to perform the reading operation, VA(j)−Vth(j) is set to the lowest among VA(1)−Vth(1) to VA(km)−Vth(km) and the precharge potential is set lower than VA(j)−Vth(j). Thus, the potential Vin of the bit line is charged to approximately VA(j)−Vth(j). The potential VA(i) (i is an integer of any of 1 to km, except j) becomes higher by increasing the word line potential VWLread_0. Therefore, VWLread_0 and Vpc are preferably determined so as to satisfy these conditions.

Note that a capacitance C1 of the capacitor 203 and a gate capacitance C2 of the transistor 201 preferably have a relation of C1>C2. Thus, the potential of the node A is largely changed when the potential of the word line is changed, so that the potential of the word line, VWLread_0, at the time of reading can be kept low.

Note that "potential Vin of the bit line (potential Vin)" used for comparison at the time of reading includes the potential of a node of the input terminal of the sense amplifier that is connected to the bit line through a switch or the like.

Figure 17:
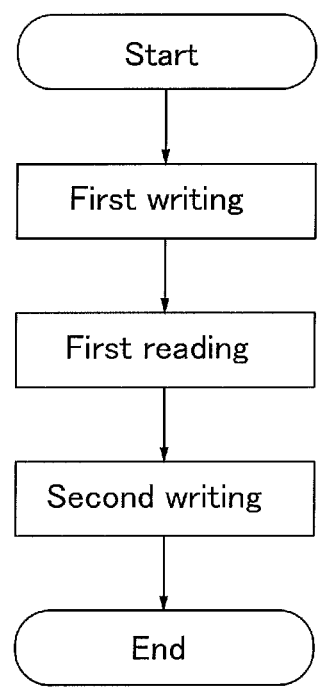
FIG. 17 illustrates a flow of a writing operation.

Next, a writing operation which is one embodiment of the present invention will be described. As illustrated in FIG. 17, a writing operation of one embodiment of the present invention includes three steps: first writing (writing for obtaining data on variation), first reading (reading for obtaining data on variation), and second writing (writing for data to be stored). Each of the steps will be described below.

The first writing is performed in order to initialize a memory cell so that the memory cell has a predetermined state. Specifically, the above-described writing operation is performed using Vwi (a potential for initialization) as the writing voltage Vwrite.

The first reading is performed in order to obtain data on variation in memory cells. The threshold voltage Vth of the transistor 201 varies between memory cells, and has a distribution illustrated in FIG. 18A, for example.

Figure 18A:
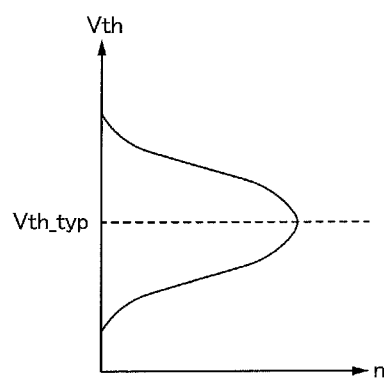
FIGS. 18A and 18B each illustrate distribution of potentials.
Figure 18B:
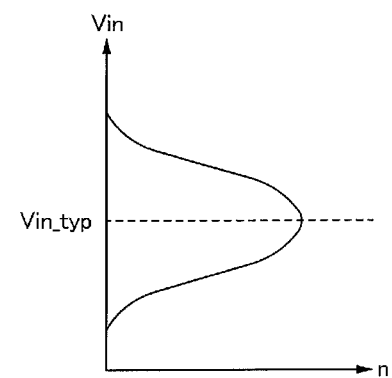

Because of such variation, the potential of the bit line BL also varies in the first reading after the first writing is performed. For example, in the case where the variation in threshold voltages Vth of the transistors 201 is as shown in FIG. 18A, variation in potentials Vin of the nodes of the input terminals of the sense amplifier (or variations in potentials of the bit lines BL) is distributed as shown in FIG. 18B.

In view of the above, in the first reading, the potential Vin of the bit line related to the reading is read out in detail in order to obtain data on variation in memory cells. Specifically, a potential Vri_j (j is an integer of any of 0 to m) selected from a plurality of potentials Vri_0 to Vri_m (m is an integer greater than 0) is used as the reading potential Vread applied to the sense amplifier in the reading circuit 212, and Vin and Vri_j are compared to each other. This comparison is performed plural times with j in Vri_j changed. Thus, it is determined that which section divided by Vri_j (section divided by Vri_j and Vri_(j+1)) the potential Vin of the bit line related to the reading belongs to.

The potential Vri_j (j is an integer of any of 0 to m) can be decided, for example, so as to correspond to the distribution of threshold voltages of the transistors 201. A voltage range including the distribution of threshold voltages of the transistors 201 is decided, and the voltage range is divided into m sections. The minimum voltage among the sections is represented by V0, and the width of each section is represented by ΔVth. A section divided by V0+i×ΔVth and V0+(i+1)×ΔVth is referred to as a section i (i is an integer of any of 0 to m−1). In the case where the threshold voltage Vth of the transistor 201 satisfies V0+j×ΔVth<Vth<V0+(j+1)×ΔVth, the potential Vri_j can be decided so that the potential Vin of the bit line satisfies Vri_j<Vin<Vri (j+1).

As described above, Vin becomes approximately VA−Vth, so that Vri_j can be set to approximately VA−(V0+(m−j)× ΔVth). Needless to say, Vri_j can be decided by simulation or experiment.

Note that the width of the distribution of (VA−Vth) that represents states of memory cells after writing is decided by ΔVth. When ΔVth is small, the distribution of states of memory cells after writing (after data to be stored is written) is narrow; whereas when ΔVth is large, the distribution of states of memory cells after writing is large. The section width of the threshold voltage ΔVth is determined in consideration of the degree "n" of multiple values of data written into a memory cell, a power supply potential, or the like.

Next, a method for multiple comparisons using a plurality of potentials Vri_0 to Vri_m (m is an integer greater than 0) in the first reading will be described below.

As a typical example, described is a method in which comparison is performed (m−1) times sequentially with a plurality of potentials Vri_1 to Vri_(m−1), so that it can be determined that which section the threshold voltage Vth of the transistor 201 of the memory cell belongs to.

Figure 19:
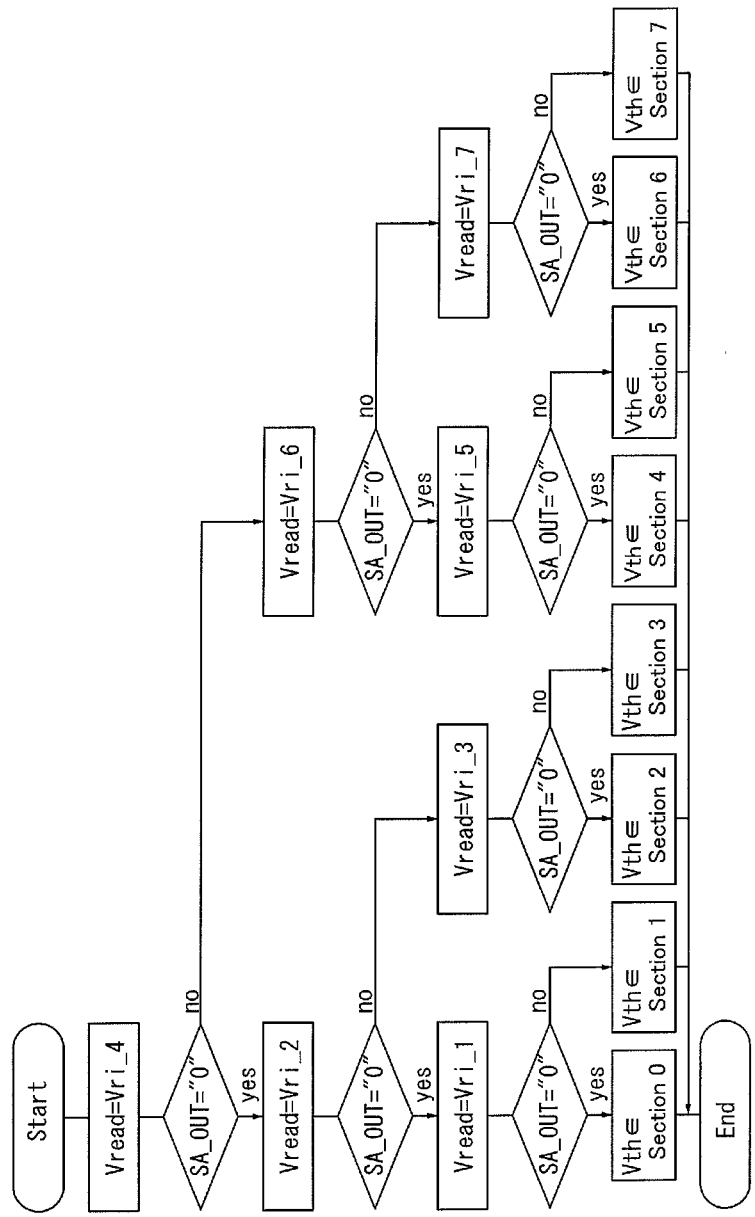
FIG. 19 is a flow chart for illustrating operation.

Moreover, a method for performing comparison plural times with the use of a comparison result fed back as illustrated in FIG. 19 can be employed. A method where which section the threshold voltage Vth of the transistor 201 of the memory cell belongs to is determined in the case where m is 8 will be described below with reference to FIG. 19. Note that comparison is performed three times in the method shown in FIG. 19.

First, a potential that is near the center of a plurality of potentials Vri_0 to Vri_8, the potential Vri_4, is used as the reading potential Vread, and first comparison with the potential Vin is performed. When the first comparison results in that the output of the sense amplifier is "0" (SA_OUT="0"), that is, Vin<Vri_4, a potential that is near the center of a plurality of potentials Vri_1 to Vri_4, the potential Vri_2, is used as the reading potential Vread, and second comparison with the potential Vin is performed. On the other hand, when the output of the sense amplifier is "1" (SA_OUT="1"), that is, Vin>Vri_4, a potential that is near the center of a plurality of potentials Vri_4 to Vri_7, the potential Vri_6, is used as the reading potential Vread, and second comparison with the potential Vin is performed.

When the comparison using the potential Vri_2 as the reading potential Vread results in SA_OUT="0", that is, Vin<Vri_2, the potential Vri_1 is used as the reading potential Vread, and third comparison with the potential Vin is performed. Similarly, when SA_OUT="1", that is, Vin>Vri_2, the potential Vri_3 is used as the reading potential Vread, and third comparison with the potential Vin is performed. Similarly, when the comparison using the potential Vri_6 as the reading potential Vread results in SA_OUT="0", that is, Vin<Vri_6, the potential Vri_5 is used as the reading potential Vread, and third comparison with the potential Vin is performed. Similarly, when SA_OUT="1", that is, Vin>Vri_6, the potential Vri_7 is used as the reading potential Vread, and third comparison with the potential Vin is performed.

When the third comparison results in Vin<Vri_1, it is determined that the threshold voltage Vth of the transistor 201 of the memory cell belongs to Section 0. Similarly, it is determined that the threshold voltage Vth of the transistor 201 of the memory cell belongs to: Section 1 when Vin>Vri_1; Section 2 when Vin<Vri_3; Section 3 when Vin>Vri_3; Section 4 when Vin<Vri_5; Section 5 when Vin>Vri_5; Section 6 when Vin<Vri_7; and Section 7 when Vin>Vri_7. In this manner, by performing comparison plural times with a comparison result fed back, the first reading can be performed with the number of comparisons that is reduced to M even in the case where the number of sections, m, is $2^M$.

In the case where comparison is performed plural times in the first reading, charging and discharging of the bit line is not involved except in the first comparison, which enables high-speed reading.

The example in which comparison is performed plural times is described above as a method for comparison using a plurality of potentials Vri_0 to Vri_m (m is an integer greater than 0); alternatively, comparison can be performed only once. Specifically, (m−1) sense amplifiers may be provided in the reading circuit.

Next, in the second writing (writing of data to be stored), predetermined data is written into the memory cell. In this embodiment, n values of "0" to "n−1" are written as data. In addition, a writing potential for writing data "i" (i is an integer any of 0 to n) in a memory cell in which the threshold voltage of the transistor 201 is a typical value Vth_typ is denoted by Vw_i.

In the second writing, when data "i" is written into a memory cell, the data writing is performed using a writing potential that is compensated on the basis of which section the memory cell belongs to. For example, where the typical value of the threshold voltage of the transistor 201, Vth_typ, belongs to Section i0, a compensation voltage in Section (i0+k) (k is an integer of any of −i0 to m−1−i0) is k×ΔVth. Table 1 shows the relation between the threshold voltage and the compensation voltage that corresponds to each section of the threshold voltage of the transistor 201.

TABLE 1

| Section | Threshold voltage (V) | Compensation voltage (V) |
|---|---|---|
| 0 | V0~V0 + ΔVth | −i0 × ΔVth |
| 1 | V0 + ΔVth~V0 + 2 × ΔVth | −(i0 − 1) × ΔVth |
| . | . | . |
| . | . | . |
| . | . | . |
| i0 | V0 + i0 × ΔVth~V0 + (i0 + 1) × ΔVth | 0 |
| i0 + 1 | V0 + (i0 + 1) × ΔVth~V0 + (i0 + 2) × ΔVth | ΔVth |
| . | . | . |
| . | . | . |
| m − 1 | V0 + (m − 1) × ΔVth~V0 + m × ΔVth | (m − 1 − i0) × ΔVth |

For example, in this embodiment, the compensation voltage is 0 in Section i0; ΔVth in a next section that is greater than Section i0 by ΔVth; and −ΔVth in a next section that is less than Section i0 by ΔVth. In the case where the memory cell belongs to Section (i0+k), data writing is performed using a compensated writing potential Vw_i+k×ΔVth.

By writing data in this manner, distribution of the state after the writing can be narrowed. As a result, the multi-valued level can be increased. Further, according to the writing operation which is one embodiment of the present invention, which involves just one data writing and data reading at the beginning, high-speed writing can be achieved as compared to a conventional writing operation with verification, which involves data writing and data reading plural times.

Figure 20A:
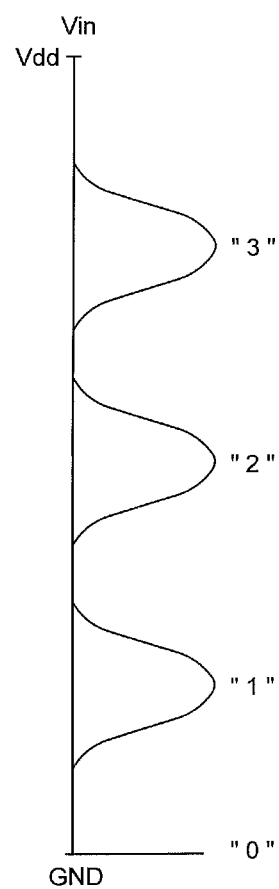
FIG. 20A illustrates an example of a state after data is written without compensation.
Figure 20B:
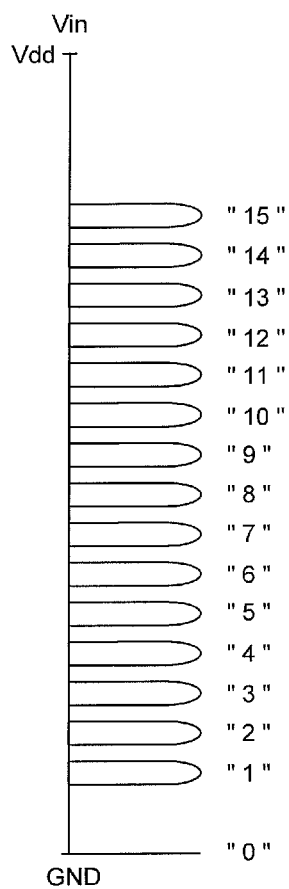
FIG. 20B illustrates an example of a state after data is written with compensation.

FIG. 20A illustrates an example after data writing without compensation (i.e., in the case where each compensation voltage is 0 V), and FIG. 20B illustrates an example after data writing with compensation. In FIG. 20A, the writing potential is fixed regardless of the memory cell, and the state after the writing has a distribution which is a similar degree to a distribution of the threshold voltage of the transistor 201. As a result, for example, the memory cell can store states as little as four values. On the other hand, in FIG. 20B, since the writing voltage is compensated for each memory cell, the state after the writing has a narrow distribution of about ΔVth. As a result, for example, the memory cell can store states as large as 16 values.

Next, a reading operation (reading operation of stored data) according to one embodiment of the present invention will be described.

In order to read the n values of "0" to "n−1" as data, comparison is performed plural times by using a potential Vri_j (j is an integer of any of 0 to n−2) selected from a plurality of potentials Vri_0 to Vri_n−2 (n−2 is an integer greater than 0) as the reading potential Vread. The reading potential Vri_j is set to a potential between a value of the potential Vin for reading data from the memory cell having data "j" and a value of the potential Vin for reading from the memory cell having data "j+1".

An example of a method for multiple comparisons using a plurality of potentials Vri_0 to Vri_n−2 (n−2 is an integer greater than 0) will be described. For example, comparison is performed (n−1) times sequentially with the plurality of potentials Vri_0 to Vri_n−2, so that it can be determined that which state among respective states of data "0" to "n−1" the memory cell has. Alternatively, a similar method to the method described using FIG. 19 on the first reading can be employed. In that case, the frequency of comparisons for data reading can be reduced. Further alternatively, (n−1) sense amplifiers may be provided, with which data reading can be performed by one comparison.

Table 2 shows an example of specific operating voltages (potentials): the multi-valued level n is 16; the power supply potential Vdd is 2.1 V; the typical value of the threshold voltage of the transistor 201, Vth_typ, is 0.3 V; the section width of the threshold voltage of the transistor 201, ΔVth, is 0.04 V; the number of sections of the threshold voltage of the transistor 201 and the number of sections of the reading potential Vin of the first reading, m, is 8; the threshold voltage of the transistor 202 is 0.1 V; and the ratio between capacitances, C1/C2, is 1. The writing potential for the first writing, Vwi, can be 0.98 V. As the potentials of the word line in reading, VWLread_1 can be 0 V and VWLread_0 can be 4 V. The precharge potential Vpc can be 0 V. The potential of the source line, VSLread, can be 2.1 V. Although the potential of a non-selected word line, VWLread_0, is higher than Vdd, the potential VWLread_0 can be lowered by making the ratio between capacitances, C1/C2, larger than 1.

TABLE 2

| | |
|---|---|
| Multi-valued level (n) | 16 |
| Power supply potential (Vdd) | 2.1 V |
| Typical value of the threshold voltage of the transistor 201 (Vth_typ) | 0.3 V |
| Section width of the threshold voltage of the transistor 201 (ΔVth) | 0.04 V |
| Number of sections of the threshold voltage of the transistor 201 and the number of sections of the reading potential Vin of the first reading (m) | 8 |
| Minimum value of the threshold voltage of the transistor 201 in section 0 (V0) | 0.12 V |
| Threshold voltage of the transistor 202 | 0.1 V |
| Writing potential for the first writing (Vwi) | 0.98 V |
| VWLread_0 | 4 V |
| VWLread_1 | 0 V |
| Vpc | 0 V |
| C1/C2 | 1 |
| VBL_0 | 0 V |
| VS1_0 | 0 V |
| VSLread | 2.1 V |
| VSLwrite | 0 V |

Further, the following values can be used: values shown in Table 3 as the compensation voltages corresponding to respective sections of the threshold voltage of the transistor 201; values shown in Table 4 as the reading potential Vri_i (i is an integer of any of 0 to 8) for the first reading; values shown in Table 5 as the writing potential before compensation, Vw_i (i is an integer of any of 0 to 15) for the second writing; and values shown in Table 6 as the reading potential Vr_i (i is an integer of any of 0 to 14) for the reading of stored data. By using these voltage values, the writing operation and the reading operation can be performed with potentials between Gnd and Vdd, except the potential of the word line, VWLread_0.

TABLE 3

| Section | Threshold voltage (V) | Compensation voltage (V) |
|---|---|---|
| 0 | 0.12~0.16 | −0.16 |
| 1 | 0.16~0.20 | −0.12 |
| 2 | 0.20~0.24 | −0.08 |
| 3 | 0.24~0.28 | −0.04 |

TABLE 3-continued

| Section | Threshold voltage (V) | Compensation voltage (V) |
|---|---|---|
| 4 | 0.28~0.32 | 0 |
| 5 | 0.32~0.36 | 0.14 |
| 6 | 0.36~0.40 | 0.08 |
| 7 | 0.40~0.44 | 0.12 |

TABLE 4

| Vri_i(V) | |
|---|---|
| Vri_0 | 0.86 |
| Vri_1 | 0.82 |
| Vri_2 | 0.78 |
| Vri_3 | 0.74 |
| Vri_4 | 0.7 |
| Vri_5 | 0.66 |
| Vri_6 | 0.62 |
| Vri_7 | 0.58 |
| Vri_8 | 0.54 |

TABLE 5

| Vw_i(V) | |
|---|---|
| Vw_0 | 0.16 |
| Vw_1 | 0.48 |
| Vw_2 | 0.58 |
| Vw_3 | 0.68 |
| Vw_4 | 0.78 |
| Vw_5 | 0.88 |
| Vw_6 | 0.98 |
| Vw_7 | 1.08 |
| Vw_8 | 1.18 |
| Vw_9 | 1.28 |
| Vw_10 | 1.38 |
| Vw_11 | 1.48 |
| Vw_12 | 1.58 |
| Vw_13 | 1.68 |
| Vw_14 | 1.78 |
| Vw_15 | 1.88 |

TABLE 6

| Vr_i(V) | |
|---|---|
| Vr_0 | 0.13 |
| Vr_1 | 0.23 |
| Vr_2 | 0.33 |
| Vr_3 | 0.43 |
| Vr_4 | 0.53 |
| Vr_5 | 0.63 |
| Vr_6 | 0.73 |
| Vr_7 | 0.83 |
| Vr_8 | 0.93 |
| Vr_9 | 1.03 |
| Vr_10 | 1.13 |
| Vr_11 | 1.23 |
| Vr_12 | 1.33 |
| Vr_13 | 1.43 |
| Vr_14 | 1.53 |

Table 7 shows another example of specific operating voltages (potentials). Here, the case where a negative potential is used as a driving potential for reading is described. For example, the case is described in which the multi-valued level n is 16; the power supply potential Vdd is 2.1 V; the typical value of the threshold voltage of the transistor 201, Vth_typ, is 0.3 V; the section width of the threshold voltage of the transistor 201, ΔVth, is 0.04 V; the number of sections of the threshold voltage of the transistor 201 and the number of sections of the reading potential Vin of the first reading, m, is 8; the threshold voltage of the transistor 202 is 0.1 V; and the ratio between capacitances, C1/C2, is 3.

The writing potential for the first writing, Vwi, can be 1.73 V. As the potentials of the word line in reading, VWLread_1 can be −1 V and VWLread_0 can be 2.1 V. The precharge potential Vpc can be −1 V. The potential of the source line, VSLread, can be 2.1 V. In this driving method, the potential of a selected word line, VWLread_1, is a negative potential while using Vdd as the potential of a non-selected word line, VWLread_0.

The writing potential for the first writing, Vwi, is 1.73 V here; however, it is not necessarily limited to that value. In the reading operation, the ratio between capacitances, C1/C2, is 3 when the potential of the word line in reading is reduced by 1 V so that VWLread_1 is −1 V; thus, the potential of the node A is reduced by 0.75 V. As a result, the potential of the node A becomes 0.98 V. That is, Vwi of 1.73 V corresponds to Vwi of 0.98 V, which is the specific operation voltage shown in Table 2.

Note that when the word line is set to a negative potential in reading, the same negative potential as that for the word line is applied to the second signal line S2. That is, the second signal line S2 in a selected row in reading is set to −1 V. In addition, in a peripheral circuit portion using a signal with a negative potential, a ground potential needs to be negative. In particular, a ground potential in the reading circuit is negative.

Note that even in the case where a negative potential is used, the absolute value of the potential of a selected word line, VWLread_1, can be reduced by making the ratio between capacitances, C1/C2, larger than 1.

TABLE 7

| | |
|---|---|
| Multi-valued level (n) | 16 |
| Power supply potential (Vdd) | 2.1 V |
| Typical value of the threshold voltage of the transistor 201 (Vth_typ) | 0.3 V |
| Section width of the threshold voltage of the transistor 201 (ΔVth) | 0.04 V |
| Number of sections of the threshold voltage of the transistor 201 and the number of sections of the reading potential Vin of the first reading (m) | 8 |
| Minimum value of the threshold voltage of the transistor 201 in section 0 (V0) | 0.12 V |
| Threshold voltage of the transistor 202 | 0.1 V |
| Writing potential for the first writing (Vwi) | 1.73 V |
| VWLread_0 | 2.1 V |
| VWLread_1 | −1 V |
| Vpc | −1 V |
| C1/C2 | 3 |
| VBL_0 | 0 V |
| VS1_0 | 0 V |
| VSLread | 2.1 V |
| VSLwrite | 0 V |

Further, the following values can be used: values shown in Table 3 as the compensation voltages corresponding to respective sections of the threshold voltage of the transistor 201; values shown in Table 4 as the reading potential Vri_i (i is an integer of any of 0 to 8) for the first reading; values shown in Table 5 as the writing potential before compensation, Vw_i (i is an integer of any of 0 to 15) for the second writing; and values shown in Table 8 as the reading potential Vr_i (i is an integer of any of 0 to 14) for the reading of stored data.

TABLE 8

| Vr_i(V) | |
|---|---|
| Vr_0 | −0.8 |
| Vr_1 | −0.7 |
| Vr_2 | −0.55 |
| Vr_3 | −0.4 |
| Vr_4 | −0.3 |
| Vr_5 | −0.15 |
| Vr_6 | −0.05 |
| Vr_7 | 0.08 |
| Vr_8 | 0.18 |
| Vr_9 | 0.28 |
| Vr_10 | 0.38 |
| Vr_11 | 0.48 |
| Vr_12 | 0.58 |
| Vr_13 | 0.68 |
| Vr_14 | 0.78 |

The reading potential Vr_i (i is an integer of any of 0 to 14) for reading of stored data can be decided in a manner similar to that of the above-described specific potential Vr_i. That is, the reading potential Vr_j is set to a potential between a value of the potential Vin for reading data from the memory cell having data "j" and a value of the potential Vin for reading from the memory cell having data "j+1". As compared to the above specific example, in the case where a potential written is high, the potential of the word line, VWLread_1, in reading is reduced by 1 V and the ratio between capacitances, C1/C2, is 3; thus, the potential Vin is reduced by 0.75 V. As a result, the potential Vr_i is also reduced by 0.75 V. In the case where a potential written is low, the transistor 201 is turned off because the potential of the word line is lowered. In that case, the ratio between capacitances is sufficiently large (C1>>C2), and the amount of a decrease in potential Vin varies depending on a writing potential.

As described above, the writing operation of one embodiment of the present invention includes the three steps: the first writing (writing for obtaining data on variation), the first reading (reading for obtaining data on variation), and the second writing (writing for data to be stored). Data on variation of the memory cell is obtained through the first writing and the first reading, and predetermined data is written into the memory cell with the use of a writing voltage that is compensated on the basis of the data on variation of the memory cell in the second writing. Accordingly, the distribution of the state after the writing operation can be narrowed. The writing operation of one embodiment of the present invention is not limited to the driving method for writing which is charging and discharging of electric charge into/from the node A in the memory cell, or the driving method for reading in which a potential that is set in accordance with the state of the memory cell is compared to a predetermined potential. As a driving method for reading, the method in which a bit line is charged by a rise of potential of a source line is described as an example; alternatively, it is possible to control the on/off state of the transistor 201 in a memory cell that is selected by controlling the potential of a word line and compare the potential Vin decided by the conductance of the NAND Memory cell with Vread.

Figure 21:
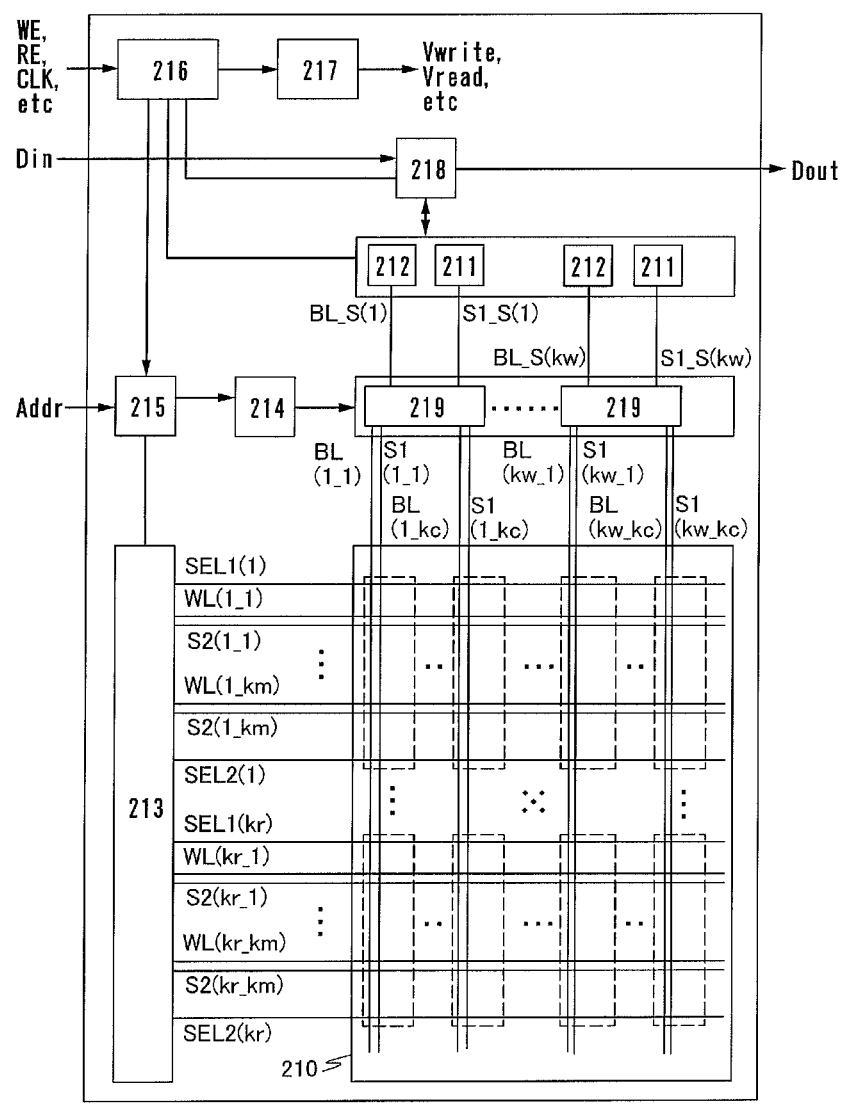
FIG. 21 illustrates a semiconductor device.

FIG. 21 illustrates an example of a block circuit diagram of a semiconductor device according to one embodiment of the present invention, including a NAND memory cell array of kr×(kc×kw). For example, in the case where the multi-valued level n is 4, the storage capacity is 2×km×kr×(kc×kw) bits, and in the case where the multi-valued level n is 16, the storage capacity is 4×km×kr×(kc×kw) bits. In general, in the case where the multi-valued level n is $2^k$ (k is an integer greater than or equal to 1), the memory capacity is k times as large as that in the case where the multi-valued level is two.

The semiconductor device illustrated in FIG. 21 includes km×kr word lines WL(1_1) to WL(kr_km); km×kr second signal lines S2(1_1) to S2(kr_km); kc×kw bit lines BL(1_1) to BL(kw_kc); kc×kw first signal lines S1(1_1) to S1(kw_kc); a memory cell array 210 in which a plurality of NAND memory cells 200(1, 1) to 200(kr, kw_kc) are arranged in a matrix of kr (rows)×kc×kw (columns) (kr, kc, and kw are natural numbers); and peripheral circuits such as the reading circuit 212, the writing circuit 211, a plurality of multiplexers 219, a driver circuit 213 for the second signal line and the word line, a column decoder 214, an address buffer 215, a data buffer 218, a potential generation circuit 217, and a control circuit 216. As another peripheral circuit, a refresh circuit or the like may be provided. Note here that kc is the number of columns selected independently by the column decoder 214; kw is the number of columns selected at the same time; kr is the number of rows of the NAND memory cells; and km is the number of rows of memory cells included in the NAND memory cell.

The circuit illustrated in FIG. 14 can be applied to the NAND memory cell 200. A NAND memory cell 200(i, j) (i is an integer of any of 1 to kr and j is an integer of any of 1 to kc×kw), which is a typical example of the NAND memory cells in this embodiment, is connected to the bit line BL(j), the first signal line S1(j), the word lines WL(i_1) to WL(i_km), the second signal lines S2(i_1) to S2(i_km), and a source line SL(j). Further, the bit lines BL(1_1) to BL(kw_kc) and the first signal lines S1(1_1) to S1(kw_kc) are connected to the multiplexers 219. The word lines word lines WL(1_1) to WL(kr_km), the second signal lines S2(1_1) to S2(kr_km), and selection lines SEL(1) to SEL1(kr) and SEL2(1) to SEL2(kr) are connected to the driver circuit 213 for the second signal line and the word line.

Next, each of the circuits will be described. The circuit illustrated in FIG. 15 and the circuit illustrated in FIG. 16 can be used as the writing circuit 211 and the reading circuit 212, respectively.

The multiplexer 219 inputs an output signal of the column decoder 214 as a control signal and connects a bit line selected from the kc bit lines to the reading circuit 212. Specifically, one signal among kc control signals is asserted, and a bit line that is controlled by the asserted control signal is connected to a line BL_S. The multiplexer 219 also connects a first signal line selected from the kc first signal lines S1 to the writing circuit 211. Specifically, one signal among kc control signals is asserted, and a first signal line that is controlled by the asserted control signal is connected to a line S1_S.

In the case of a semiconductor device in which kc is 1, the column decoder 214 and the multiplexer 219 are not necessarily provided. In that case, the writing circuit 211 may be directly connected to the first signal line S1 and the reading circuit 212 may be directly connected to the bit line BL.

The column decoder 214 uses a column address output from the address buffer 215, a control signal output from the control circuit 216, or the like as an input signal, and asserts one output signal specified by the address and deasserts other output signals.

The driver circuit 213 for the second signal line and the word line uses a row address output from the address buffer 215, a control signal output from the control circuit 216, or the like as an input signal, and applies predetermined potentials to a word line and a second signal line that are specified by the address; word lines and second signal lines that are connected to NAND memory cells in the same row as the specified word line and second signal line; and other word lines and other second signal lines that are connected to NAND memory cells in the other rows.

The potential generation circuit 217 outputs a writing potential Vwrite, a reading potential Vread, a precharge potential Vpc, and the like in accordance with a control signal output from the control circuit 216. As the writing potential Vwrite, Vwi is output in the first writing, and a writing potential Vw_j (j is an integer of any of 0 to n−1) is output in the second writing in accordance with a writing potential that is compensated depending on writing data and the result of the first reading. As the reading potential Vread, a potential Vr_j (j is an integer of any of 0 to (n−2)) and a potential Vri_j (j is an integer of any of 0 to (m+1)) are output in the data reading operation and the first reading, respectively. These potentials are specified by the output signal of the control circuit. For example, the potential generation circuit 217 may include a digital-analog converter (DAC) that uses as an input signal, a digital signal having a voltage level output from the control circuit.

The potential generation circuit 217 may output a plurality of writing potentials Vwrite and a plurality of reading potentials Vread. For example, in the case where a plurality of writing circuits 211 is provided and different potentials are written thereto, appropriate potentials can be supplied to the writing circuits 211 by a plurality of writing potentials Vwrite. On the other hand, for example, in the case where a plurality of reading circuits 212 is provided and a method for performing comparison plural times with a comparison result fed back as illustrated in FIG. 19 is employed, appropriate potentials can be supplied to the reading circuits 212 by a plurality of reading potentials Vread.

The address buffer 215 uses an address signal input to the semiconductor device or a control signal output from the control signal circuit as an input signal, and outputs a predetermined column address or a predetermined row address at a predetermined timing in accordance with the control signal. The address buffer 215 may include an address register.

The data buffer 218 uses a signal Din input to the semiconductor device, an output signal from the reading circuit 212, or a control signal output from the control circuit 216 as an input signal and outputs a signal input to the writing circuit 211, a signal Dout output from the semiconductor device, or a signal input to the control circuit 216 as an output signal. The data buffer 218 includes a data register, and stores each input signal into the data register at a predetermined timing in accordance with the control signal. The output signal input to the control circuit 216 is a signal for selecting the writing potential Vwrite or the reading potential Vread, which is, for example, data to be written into the memory cell or data read out from the memory cell.

The control circuit 216 uses a signal input to the semiconductor device, such as WE, RE, or CLK, or the output signal from the data buffer 218 as an input signal, and outputs a variety of control signals as an output signal, to the potential generation circuit 217, the address buffer 215, the data buffer 218, the column decoder 214, the driver circuit 213 for the second signal line and the word line, or the like. The control signal is a timing control signal for performing the data writing operation or the data reading operation or a control signal having data such as a potential to be used. In particular, in the second writing, the control circuit 216 generates data on a compensated writing potential from data on a writing potential and data on a compensation voltage, and outputs the data. The control circuit 216 may include a ROM for generating data on a compensated writing potential from data on a writing potential and data on a compensation voltage. For example, in the case where data on the writing potential is 4 bits, data on the compensation voltage is 3 bits, and data on the compensated writing potential is 6 bits, the control circuit 216 may include an 8 Kbit ROM. Alternatively, the control circuit 216 may include an arithmetic circuit for generating data on a compensated writing potential from data on a writing potential and data on a compensate voltage.

Note that although the reading potential Vread is generated in the potential generation circuit 217 in this embodiment, the reading potential Vread may be generated by another structure. For example, it is possible to employ a method of providing a reference memory cell. When a circuit with the same configuration as that for generating Vin by selection of a memory cell is provided by using a reference memory cell, Vread can be generated. The value of Vread can be controlled by control of the potential of the node A in the reference memory cell.

The semiconductor device according to this embodiment can store data for an extremely long time because the off-state current of the transistor 202 is low. That is, refresh operation which is necessary in a DRAM and the like is not needed, so that power consumption can be suppressed. Moreover, the semiconductor device according to this embodiment can be used as a non-volatile memory device substantially.

Since data writing or the like is performed with switching operation of the transistor 202, high voltage is not necessary and deterioration of the element does not occur. Furthermore, since data is written or erased depending on on/off of the transistor, high-speed operation can be easily realized. Further, it is possible to rewrite data directly by controlling the potential to be input to the transistor. For that reason, erasing operation which is necessary for a flash memory or the like is not needed, so that a reduction in operation speed due to erasing operation can be prevented.

By using a transistor that uses a material which is not an oxide semiconductor and can operate at higher speed than a transistor using an oxide semiconductor, stored data can be read out at high speed.

Further, since the semiconductor device according to this embodiment is a multi-valued type, the storage capacity per unit area can be increased. Accordingly, size reduction and high integration of a semiconductor device can be achieved.

As described above, data on variation of the memory cell is obtained and a writing potential based on the variation data is written into the memory cell, whereby the distribution of the state of the memory cell after the data writing can be narrowed. Thus, the multi-valued level can be increased. According to the writing operation which is one embodiment of the present invention, the potential of the node that has a floating state can be directly controlled, so that the threshold voltage can be controlled with a high degree of accuracy by the writing operation having three steps of the first writing, the first reading, and the second writing. Accordingly, high-speed writing can be realized as compared to a conventional writing operation with verification, which involves data writing and data reading plural times.

Embodiment 3

In this embodiment, examples of electronic devices each including the semiconductor device according to any of the above-described embodiments will be described with reference to FIGS. 24A to 24F. The semiconductor device according to the above embodiment can store data even when power is not supplied. Moreover, degradation due to writing or erasing does not occur. Furthermore, the semiconductor device can operate at high speed. For these reasons, an electronic device with a novel structure can be provided by using the semiconductor device. Note that the semiconductor devices according to the above embodiment are integrated and mounted on a circuit board or the like, and placed inside an electronic device.

Figure 24A:
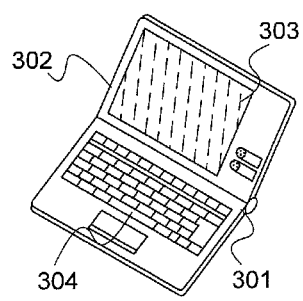
FIGS. 24A to 24F each illustrate an electronic device.

FIG. 24A illustrates a notebook personal computer including the semiconductor device according to the above embodiment. The notebook personal computer includes a main body 301, a housing 302, a display portion 303, a keyboard 304, and the like. The semiconductor device according to one embodiment of the present invention is applied to a notebook personal computer, whereby the notebook personal computer can hold data even when power is not supplied. Moreover, degradation due to writing or erasing does not occur. Further, the notebook personal computer can operate at high speed. For these reasons, it is preferable to apply the semiconductor device according to one embodiment of the present invention to a notebook personal computer.

Figure 24D:
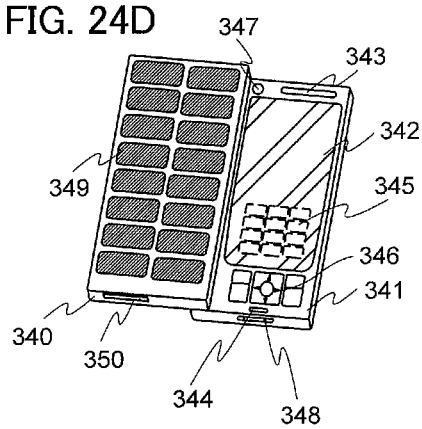
Figure 24B:
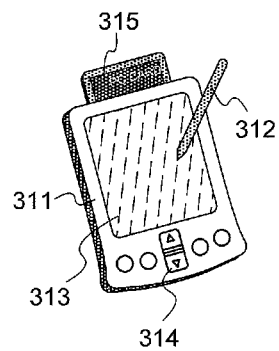

FIG. 24B illustrates a personal digital assistant (PDA) including the semiconductor device according to the above embodiment. A main body 311 is provided with a display portion 313, an external interface 315, operation buttons 314, and the like. A stylus 312 that is an accessory is used for operating the PDA. The semiconductor device according to one embodiment of the present invention is applied to a PDA, whereby the PDA can hold data even when power is not supplied. Moreover, degradation due to writing or erasing does not occur. Further, the PDA can operate at high speed. For these reasons, it is preferable to apply the semiconductor device according to one embodiment of the present invention to a PDA.

Figure 24E:
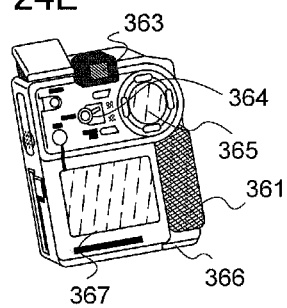
Figure 24C:
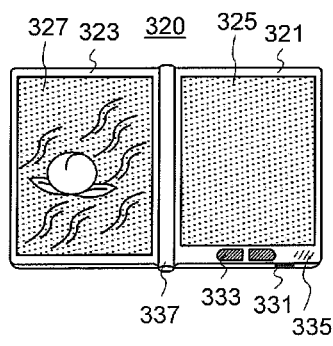

FIG. 24C illustrates an e-book reader 320 as an example of electronic paper including the semiconductor device according to the above embodiment. The e-book reader 320 includes two housings: a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. The semiconductor device according to one embodiment of the present invention is applied to electronic paper, whereby the electronic paper can hold data even when power is not supplied. Moreover, degradation due to writing or erasing does not occur. Further, the electronic paper can operate at high speed. For these reasons, it is preferable to apply the semiconductor device according to one embodiment of the present invention to electronic paper.

A display portion 325 is incorporated in the housing 321 and a display portion 327 is incorporated in the housing 323. The display portion 325 and the display portion 327 may display one image or different images. When the display portion 325 and the display portion 327 display different images, for example, the right display portion (the display portion 325 in FIG. 24C) can display text and the left display portion (the display portion 327 in FIG. 24C) can display images.

FIG. 24C illustrates an example in which the housing 321 is provided with an operation portion and the like. For example, the housing 321 is provided with a power switch 331, operation keys 333, a speaker 335, and the like. Pages can be turned with the operation keys 333. Note that a keyboard, a pointing device, or the like may also be provided on the surface of the housing, on which the display portion is provided. Furthermore, an external connection terminal (e.g., an earphone terminal, a USB terminal, or a terminal that can be connected to various cables such as an AC adapter and a USB cable), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

FIG. 24D illustrates a mobile phone including the semiconductor device according to the above embodiment. The mobile phone includes two housings: a housing 340 and a housing 341. The housing 341 is provided with a display panel 342, a speaker 343, a microphone 344, a pointing device 346, a camera lens 347, an external connection terminal 348, and the like. The housing 340 is provided with a solar cell 349 for charging the mobile phone, an external memory slot 350, and the like. In addition, an antenna is incorporated in the housing 341. The semiconductor device according to one embodiment of the present invention is applied to a mobile phone, whereby the mobile phone can hold data even when power is not supplied. Moreover, degradation due to writing or erasing does not occur. Further, the mobile phone can operate at high speed. For these reasons, it is preferable to apply the semiconductor device according to one embodiment of the present invention to a mobile phone.

The display panel 342 has a touch panel function. A plurality of operation keys 345 displayed as images are shown by dashed lines in FIG. 24D. Note that the mobile phone includes a booster circuit for boosting a voltage output from the solar cell 349 to a voltage necessary for each circuit. Moreover, the mobile phone can include a contactless IC chip, a small recording device, or the like in addition to the above structure.

The direction of display on the display panel 342 is changed as appropriate depending on applications. Further, the camera lens 347 is provided on the same surface as the display panel 342, so that the mobile phone can be used as a videophone. The speaker 343 and the microphone 344 can be used for videophone calls, recording and playing sound, and the like as well as voice calls. Moreover, the housings 340 and 341 in a state where they are developed as illustrated in FIG. 24D can be slid so that one is lapped over the other. Therefore, the size of the mobile phone can be reduced, which makes the mobile phone suitable for being carried.

The external connection terminal 348 can be connected to a variety of cables such as an AC adapter or a USB cable, so that the mobile phone can be charged or can perform data communication. Moreover, the mobile phone can store and move a larger amount of data by inserting a recording medium into the external memory slot 350. Further, the mobile phone may have an infrared communication function, a television reception function, or the like in addition to the above functions.

FIG. 24E illustrates a digital camera including the semiconductor device according to the above embodiment. The digital camera includes a main body 361, a display portion (A) 367, an eyepiece portion 363, an operation switch 364, a display portion (B) 365, a battery 366, and the like. The semiconductor device according to one embodiment of the present invention is applied to a digital camera, whereby the digital camera can hold data even when power is not supplied. Moreover, degradation due to writing or erasing does not occur. Further, the digital camera can operate at high speed.

For these reasons, it is preferable to apply the semiconductor device according to one embodiment of the present invention to a digital camera.

Figure 24F:
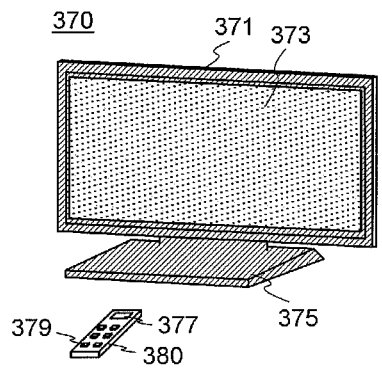

FIG. 24F illustrates a television set including the semiconductor device according to the above embodiment. In a television set 370, a display portion 373 is incorporated in a housing 371. Images can be displayed on the display portion 373. Here, the housing 371 is supported by a stand 375.

The television set 370 can be operated by an operation switch of the housing 371 or a separate remote controller 380. With operation keys 379 of the remote controller 380, channels and volume can be controlled and images displayed on the display portion 373 can be controlled. Moreover, the remote controller 380 may include a display portion 377 for displaying data output from the remote controller 380. The semiconductor device according to one embodiment of the present invention is applied to a television set, whereby the television set can hold data even when power is not supplied. Moreover, degradation due to writing or erasing does not occur. Furthermore, the television set can operate at high speed. For these reasons, it is preferable to apply the semiconductor device according to one embodiment of the present invention to a television set.

Note that the television set 370 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

The structures and methods described in this embodiment can be combined as appropriate with any of the structures and methods described in the other embodiments.

This application is based on Japanese Patent Application serial No. 2009-270667 filed with Japan Patent Office on Nov. 27, 2009, the entire contents of which are hereby incorporated by reference.

The invention claimed is:
1. A semiconductor device comprising:
a source line;
a bit line;
a first signal line;
a plurality of second signal lines;
a plurality of word lines;
a plurality of memory cells connected in series between the source line and the bit line;
a driver circuit configured to drive the plurality of second signal lines and the plurality of word lines so as to select a memory cell specified by an address signal;
a writing circuit configured to output a writing potential to the first signal line;
a reading circuit configured to compare a plurality of reading potentials and a bit line potential input from the bit line connected to the specified memory cell;
a control circuit configured to select any of a plurality of compensation voltages in response to a comparison result of the bit line potential and the plurality of reading potentials; and
a potential generation circuit configured to generate the writing potential and the plurality of reading potentials to be supplied to the writing circuit and the reading circuit,
wherein one of the plurality of memory cells comprises:
a first transistor having a first gate electrode, a first source electrode, and a first drain electrode;

a second transistor having a second gate electrode, a second source electrode, and a second drain electrode; and a capacitor, wherein a substrate including a semiconductor material is provided with the first transistor, wherein the second transistor includes an oxide semiconductor layer, and wherein the first gate electrode, one of the second source electrode and the second drain electrode, and one of electrodes of the capacitor are electrically connected to each other, wherein the source line and the first source electrode are electrically connected to each other, wherein the bit line and the first drain electrode are electrically connected to each other, wherein the first signal line and the other of the second source electrode and the second drain electrode are electrically connected to each other, wherein one of the plurality of second signal lines and the second gate electrode are electrically connected to each other, wherein one of the plurality of word lines and the other of the electrodes of the capacitor are electrically connected to each other, and wherein the oxide semiconductor layer is formed using an In—Ga—Zn—O-based oxide semiconductor material.

2. A semiconductor device comprising:

a source line;

a bit line;

a first signal line;

a plurality of second signal lines;

a plurality of word lines;

a plurality of memory cells connected in series between the source line and the bit line;

a driver circuit configured to drive the plurality of second signal lines and the plurality of word lines so as to select a memory cell specified by an inputted address signal;

a writing circuit configured to output a first writing potential to the first signal line in a first writing operation, and output any of a plurality of second writing potentials to the first signal line in a second writing operation;

a reading circuit configured to read data of the specified memory cell by comparing a first bit line potential input from the bit line connected to the specified memory cell and a plurality of first reading potentials in a first reading operation, and comparing a second bit line potential input from the bit line connected to the specified memory cell and a plurality of second reading potentials in a second reading operation;

a control circuit configured to select any of a plurality of compensation voltages in response to a comparison result of the first bit line potential and the plurality of first reading potentials, and select any of the plurality of second writing potentials; and a potential generation circuit configured to generate the first writing potential, the plurality of second writing potentials, the plurality of first reading potentials, and the plurality of second reading potentials to be supplied to the writing circuit and the reading circuit, wherein one of the plurality of memory cells comprises:

a first transistor having a first gate electrode, a first source electrode, and a first drain electrode;

a second transistor having a second gate electrode, a second source electrode, and a second drain electrode; and a capacitor, wherein a substrate including a semiconductor material is provided with the first transistor, wherein the second transistor includes an oxide semiconductor layer, and wherein the first gate electrode, one of the second source electrode and the second drain electrode, and one of electrodes of the capacitor are electrically connected to each other, wherein the source line and the first source electrode are electrically connected to each other, wherein the bit line and the first drain electrode are electrically connected to each other, wherein the first signal line and the other of the second source electrode and the second drain electrode are electrically connected to each other, wherein one of the plurality of second signal lines and the second gate electrode are electrically connected to each other, wherein one of the plurality of word lines and the other of the electrodes of the capacitor are electrically connected to each other, and wherein the oxide semiconductor layer is formed using an In—Ga—Zn—O-based oxide semiconductor material.

3. The semiconductor device according to claim 1, further comprising:

a first selection line;

a second selection line;

a third transistor having a gate electrode electrically connected to the first selection line; and a fourth transistor having a gate electrode electrically connected to the second selection line, wherein the bit line is electrically connected to the first drain electrode through the third transistor, and wherein the source line is electrically connected to the first source electrode through the fourth transistor.

4. The semiconductor device according to claim 1, wherein the first transistor includes a channel formation region provided in the substrate including the semiconductor material, impurity regions provided so as to sandwich the channel formation region, a first gate insulating layer over the channel formation region, the first gate electrode over the first gate insulating layer, and the first source electrode and the first drain electrode electrically connected to the impurity regions.

5. The semiconductor device according to claim 1, wherein the second transistor includes the second gate electrode over the substrate including the semiconductor material, a second gate insulating layer over the second gate electrode, the oxide semiconductor layer over the second gate insulating layer, and the second source electrode and the second drain electrode electrically connected to the oxide semiconductor layer.

6. The semiconductor device according to claim 1, wherein the substrate including the semiconductor material is a single crystal semiconductor substrate or an SOI substrate.

7. The semiconductor device according to claim 1, wherein the semiconductor material is silicon.

8. The semiconductor device according to claim 1, wherein the oxide semiconductor layer includes a crystal of $In_2Ga_2ZnO_7$.

9. The semiconductor device according to claim 1, wherein concentration of hydrogen in the oxide semiconductor layer is $5\times10^{19}$ atoms/cm$^3$ or less.

10. The semiconductor device according to claim 1, wherein an off-state current of the second transistor is $1\times10^{-13}$ A or less.

11. A semiconductor device comprising:

a source line;

a bit line;

a first memory cell and a second memory cell connected in series between the source line and the bit line;
a first signal line electrically connected to the first memory cell and the second memory cell;
two second signal lines, one of the two second signal lines electrically connected to the first memory cell, the other of the two second signal lines electrically connected to the second memory cell;
two word lines, one of the two word lines electrically connected to the first memory cell, the other of the two word lines electrically connected to the second memory cell;
a driver circuit electrically connected to the two second signal lines and the two word lines, and configured to select a memory cell specified by an inputted address signal;
a writing circuit configured to output a writing potential to the first signal line;
a reading circuit configured to compare a plurality of reading potentials and a bit line potential input from the bit line connected to the specified memory cell;
a control circuit configured to select any of a plurality of compensation voltages in response to a comparison result of the bit line potential and the plurality of reading potentials; and
a potential generation circuit configured to generate the writing potential and the plurality of reading potentials to be supplied to the writing circuit and the reading circuit,
wherein each of the first memory cell and the second memory cell comprises at least one transistor comprising an oxide semiconductor layer, and
wherein the oxide semiconductor layer is formed using an In—Ga—Zn—O-based oxide semiconductor material.

12. A semiconductor device comprising:
a source line;
a bit line;
a first memory cell and a second memory cell connected in series between the source line and the bit line;
a first signal line electrically connected to the first memory cell and the second memory cell;
two second signal lines, one of the two second signal lines electrically connected to the first memory cell, the other of the two second signal lines electrically connected to the second memory cell;
two word lines, one of two the word lines electrically connected to the first memory cell, the other of the two word lines electrically connected to the second memory cell;
a driver circuit electrically connected to the two second signal lines and the two word lines, and configured to select the first memory cell or the second memory cell specified by an inputted address signal;
a writing circuit configured to output a first writing potential to the first signal line in a first writing operation, and output any of a plurality of second writing potentials to the first signal line in a second writing operation;
a reading circuit configured to read data of the specified memory cell by comparing a first bit line potential input from the bit line connected to the specified memory cell and a plurality of first reading potentials in a first reading operation, and comparing a second bit line potential input from the bit line connected to the specified memory cell and a plurality of second reading potentials in a second reading operation;
a control circuit configured to select any of a plurality of compensation voltages in response to a comparison result of the first bit line potential and the plurality of first reading potentials, and select any of the plurality of second writing potentials; and
a potential generation circuit configured to generate the first writing potential, the plurality of second writing potentials, the plurality of first reading potentials, and the plurality of second reading potentials to be supplied to the writing circuit and the reading circuit,
wherein each of the first memory cell and the second memory cell comprises a first transistor and a second transistor,
wherein the second transistor includes a channel region comprising an oxide semiconductor layer, and
wherein the oxide semiconductor layer is formed using an In—Ga—Zn—O-based oxide semiconductor material.

13. The semiconductor device according to claim 12, further comprising a capacitor,
wherein the first transistor is formed on or in a substrate including a semiconductor material,
wherein a gate electrode of the first transistor is electrically connected to the capacitor, and
wherein one of a source electrode or a drain electrode of the second transistor is electrically connected to the gate electrode of the first transistor.

14. The semiconductor device according to claim 13, wherein the substrate including the semiconductor material is a single crystal semiconductor substrate or an SOI substrate.

15. The semiconductor device according to claim 13, wherein the semiconductor material is silicon.

16. The semiconductor device according to claim 13, wherein the oxide semiconductor layer includes a crystal of $In_2Ga_2ZnO_7$.

17. The semiconductor device according to claim 13, wherein concentration of hydrogen in the oxide semiconductor layer is $5 \times 10^{19}$ atoms/cm$^3$ or less.

18. The semiconductor device according to claim 13, wherein an off-state current of the second transistor is $1 \times 10^{-13}$ A or less.

* * * * *